US012370518B2

(12) United States Patent
Lee et al.

(10) Patent No.: US 12,370,518 B2
(45) Date of Patent: Jul. 29, 2025

(54) CORE-SHELL STRUCTURED PEROVSKITE NANOCRYSTALLINE PARTICLE LIGHT-EMITTING BODY, METHOD OF PREPARING THE SAME AND LIGHT EMITTING DEVICE USING THE SAME

(71) Applicant: SN DISPLAY CO., LTD., Seoul (KR)

(72) Inventors: Tae-Woo Lee, Pohang-si (KR); Sanghyuk Im, Hwaseong-si (KR); Young-Hoon Kim, Daejeon (KR); Himchan Cho, Daegu (KR)

(73) Assignee: SN DISPLAY CO., LTD. (KR)

( * ) Notice: Subject to any disclaimer, the term of this patent is extended or adjusted under 35 U.S.C. 154(b) by 572 days.

(21) Appl. No.: 17/535,570

(22) Filed: Nov. 24, 2021

(65) Prior Publication Data

US 2022/0085301 A1   Mar. 17, 2022

Related U.S. Application Data

(63) Continuation of application No. 15/524,735, filed as application No. PCT/KR2015/011960 on Nov. 6, 2015, now Pat. No. 11,205,757.

(30) Foreign Application Priority Data

Nov. 6, 2014  (KR) .................. 10-2014-0153970
Nov. 6, 2015  (KR) .................. 10-2015-0156175

(51) Int. Cl.
*C09K 11/72*   (2006.01)
*B01J 13/06*   (2006.01)
(Continued)

(52) U.S. Cl.
CPC ............. *B01J 13/06* (2013.01); *C09K 11/025* (2013.01); *C09K 11/06* (2013.01); *C09K 11/665* (2013.01);
(Continued)

(58) Field of Classification Search
CPC ..... C09K 11/664; C09K 11/665; C09K 11/72; C01P 2002/34; Y10T 428/2991; Y10T 428/2998
See application file for complete search history.

(56) References Cited

U.S. PATENT DOCUMENTS 6,777,871 B2   8/2004   Duggal et al.
8,109,153 B2   2/2012   Kirst
(Continued)

FOREIGN PATENT DOCUMENTS

CN   104134711 A   11/2014
JP   2001060497 A   3/2001
(Continued)

OTHER PUBLICATIONS

Jia et al., CsPbX3/Cs4PbX6 core/shell perovskite nanocrystals, Chem. Commun.,2018, 54,6300 (Year: 2018).*
(Continued)

*Primary Examiner* — Hoa (Holly) Le
(74) *Attorney, Agent, or Firm* — Renaissance IP Law Group LLP

(57) ABSTRACT

Provided are a core-shell structured perovskite nanocrystalline particle light-emitting body, a method of preparing the same, and a light emitting device using the same. The core-shell structured organic-inorganic hybrid perovskite nanocrystalline particle light-emitting body or metal halide perovskite nanocrystalline particle light-emitting body is able to be dispersed in an organic solvent, and has a perovskite nanocrystal structure and a core-shell structured nanocrystalline particle structure. Therefore, in the perovskite nanocrystalline particle light-emitting body of the present invention, as a shell is formed of a substance having a wider band gap than that of a core, excitons may be more dominantly confined in the core, and durability of the nanocrystal may be improved to prevent exposure of the
(Continued)

core perovskite to the air using a perovskite or inorganic semiconductor, which is stable in the air, or an organic polymer.

16 Claims, 11 Drawing Sheets

(51) Int. Cl.
| | |
|---|---|
| C09K 11/02 | (2006.01) |
| C09K 11/06 | (2006.01) |
| C09K 11/66 | (2006.01) |
| H01G 9/20 | (2006.01) |
| H10K 50/135 | (2023.01) |
| H10K 71/15 | (2023.01) |
| H10K 85/30 | (2023.01) |
| H10K 85/50 | (2023.01) |
| B82Y 20/00 | (2011.01) |
| B82Y 30/00 | (2011.01) |
| B82Y 40/00 | (2011.01) |
| H10K 30/30 | (2023.01) |
| H10K 30/35 | (2023.01) |
| H10K 30/50 | (2023.01) |
| H10K 50/11 | (2023.01) |
| H10K 50/115 | (2023.01) |
| H10K 85/10 | (2023.01) |

(52) U.S. Cl.
CPC ......... *H01G 9/2059* (2013.01); *H10K 50/135* (2023.02); *H10K 71/15* (2023.02); *H10K 85/30* (2023.02); *H10K 85/50* (2023.02); *B82Y 20/00* (2013.01); *B82Y 30/00* (2013.01); *B82Y 40/00* (2013.01); *C09K 2211/10* (2013.01); *C09K 2211/188* (2013.01); *H10K 30/30* (2023.02); *H10K 30/35* (2023.02); *H10K 30/50* (2023.02); *H10K 50/11* (2023.02); *H10K 50/115* (2023.02); *H10K 85/1135* (2023.02); *Y10S 977/774* (2013.01); *Y10S 977/812* (2013.01); *Y10S 977/892* (2013.01); *Y10S 977/948* (2013.01); *Y10S 977/95* (2013.01)

(56) References Cited

U.S. PATENT DOCUMENTS

| | | | |
|---|---|---|---|
| 9,109,153 B2 | 8/2015 | Shin et al. | |
| 10,633,584 B2 | 4/2020 | Zhong et al. | |
| 10,964,896 B2* | 3/2021 | Lee | C09K 11/025 |
| 11,205,757 B2* | 12/2021 | Lee | H01G 9/2059 |
| 11,730,051 B2* | 8/2023 | Lee | H10K 85/141 |
| | | | 257/13 |
| 2001/0033135 A1 | 10/2001 | Duggal et al. | |
| 2002/0016306 A1 | 2/2002 | Hutchison et al. | |
| 2004/0023010 A1 | 2/2004 | Bulovic et al. | |
| 2004/0095658 A1 | 5/2004 | Buretea et al. | |
| 2005/0061363 A1 | 3/2005 | Ginley et al. | |
| 2006/0236918 A1 | 10/2006 | Jun et al. | |
| 2007/0151597 A1 | 7/2007 | Chen et al. | |
| 2008/0014463 A1 | 1/2008 | Varadarajan et al. | |
| 2009/0305231 A1 | 12/2009 | Weidemaier et al. | |
| 2010/0051898 A1 | 3/2010 | Kim et al. | |
| 2010/0129529 A1 | 5/2010 | Shin et al. | |
| 2010/0294355 A1 | 11/2010 | Choi et al. | |
| 2011/0253217 A1 | 10/2011 | Grossman et al. | |
| 2012/0273726 A1 | 11/2012 | Zhuravleva et al. | |
| 2013/0190493 A1 | 7/2013 | Naasani | |
| 2016/0380136 A1 | 12/2016 | Ning et al. | |
| 2017/0233645 A1 | 8/2017 | Zhong et al. | |
| 2017/0324057 A1 | 11/2017 | Friend et al. | |
| 2017/0346024 A1 | 11/2017 | Lee et al. | |
| 2018/0002354 A1* | 1/2018 | Sum | C09K 11/02 |
| 2018/0196164 A1 | 7/2018 | Friend et al. | |
| 2018/0273841 A1* | 9/2018 | Luchinger | C09K 11/665 |
| 2019/0348577 A1* | 11/2019 | Pathak | H01L 33/0075 |
| 2021/0265574 A1* | 8/2021 | Lee | H10K 85/141 |

FOREIGN PATENT DOCUMENTS

| | | |
|---|---|---|
| JP | 2003309308 A | 10/2003 |
| JP | 2007173755 A | 7/2007 |
| JP | 2008227330 A | 9/2008 |
| JP | 2009006548 A | 1/2009 |
| JP | 2010037540 A | 2/2010 |
| JP | 2010061098 A | 3/2010 |
| JP | 4863745 B2 | 1/2012 |
| JP | 2018525671 A | 9/2018 |
| KR | 20010015084 A | 2/2001 |
| KR | 20100027892 A | 3/2010 |
| KR | 20100034003 A | 3/2010 |
| KR | 20140003998 A | 1/2014 |
| KR | 20140007045 A | 1/2014 |
| KR | 20140035287 A | 3/2014 |
| WO | 2013171517 A1 | 11/2013 |
| WO | 2016072806 A2 | 5/2016 |

OTHER PUBLICATIONS

Yan et al., Ultrastable CsPbBr3 Perovskite Quantum Dot and Their Enhanced Amplified Spontaneous Emission by Surface Ligand Modification, Small 2019, 15, 1901173 (Year: 2019).*

Ayguler, Meltem F., et al., "Light-Emitting Electrochemical Cells Based on Hybrid Lead Halide Perovskite Nanoparticles", The Journal of Physical Chemistry C, 119, 21, 12047-12054, Apr. 15, 2015.

Chen, Zhenhua et al., "Corrigendum on Shape-controlled synthesis of organolead halide perovskite nanocrystals and their tunable optical absorption", (2014 Mater. Res. Express 1 015034). Materials Research Express.

Chen, Zhenhua et al., "Shape-controlled synthesis of organolead halide perovskite nanocrystals and their tunable optical absorption", Materials Research Expresss 1, 2014.

Gonzalez-Carrero et al., "Maximizing the emissive properties of CH3N H3PbBr3 perovskite nanoparticles", 2015, J. Mater. Chem. A, 2015,3,9187-9193, Jan. 2015.

International Search Report for PCT/KR2015/011957 mailed Mar. 25, 2016.

International Search Report for PCT/KR2015/011958 mailed Mar. 21, 2016.

International Search Report for PCT/KR2015/011959 mailed Mar. 14, 2016.

International Search Report for PCT/KR2015/011963 mailed Mar. 10, 2016.

Junwu, Zhu et al., "Solution-Phase Synthesis and Characterization of Perovskite LaCoO3 Nanocrystals via A Co-Precipitation Route", Journal of Rare Earths vol. 25, Issue 5, Oct. 2007, pp. 601-604.

Kojima, Akihiro et al., "Highly Luminescent Lead Bromide Perovskite Nanoparticles Synthesized with Porous Alumina Media", Chemistry Letters, Apr. 5, 2012, vol. 41, No. 4, p. 397-399.

Koole, Rolf et al., "Size Effects on Semiconductor Nanoparticles", Nanoparticles, Springer-Verlag Berlin Heidelberg 2014, p. 13-51.

Lim, Kyung-Geun et al., "Boosting the Power Conversion Efficiency of Perovskite Solar Cells Using Self-Organized Polymeric Hole Extraction Layers with High Work Function", Advance Materials, 2014, 26: 6461-6466.

Loyd, Matthew et al., "Crystal structure and thermal expansion of CsCal3:Eu and CsSrBr3:Eu scintillators", Journal of Crystal Growth, vol. 481, Jan. 1, 2018, pp. 35-39, Jan. 1, 2018, Elsevier.

Mali et al., "Highly stable and efficient solid-state solar cells based on methylammonium lead bromide (CH3NH3PbBr3) perovskite quantum dots", NPG Asia Materials, Jun. 9, 2015, pp. 1-9.

Mitzi, D. B. et al., "Organic-inorganic electronics", IBM Journal of Research and Development, vol. 45, No. 1, Jan. 2001, pp. 29-45.

Muthu, Chinnadurai et al., "Luminescent hybrid perovskite nanoparticles as a new platform for selective detection of 2,4,6-trinitrophenol", RSC Advances, Issue 99, Oct. 2014, vol. 4, 55908-55911.

(56) References Cited

OTHER PUBLICATIONS

O'Brien, Stephen et al., "Synthesis of Monodisperse Nanoparticles of Barium Titanate: Toward a Generalized Strategy of Oxide Nanoparticle Synthesis", J. Am. Chem. Soc. 2001, 123, 48, 12085-12086 Publication Date: Nov. 7, 2001.

Papavassiliou, G. C., "Synthetic Three-and Lower-Dimensional Semiconductors Based on Inorganic Units", Molecular Crystals and Liquid Crystals Science and Technology, 1996, vol. 286, pp. 231-238.

Papavassiliou, George C., "Nanocrystalline/microcrystalline materials based on lead-halide units", Journal of Materials Chemistry, 2012, vol. 22, 8271-8280.

Schmidt et al., "Nontemplate Synthesis of CH3NH3PbBr3 Perovskite Nanoparticles", 2014, J. Am. Chem. Soc., 2014, 136 (3), pp. 850-853, Publication Date: Jan. 3, 2014.

Schmidt, L. C. et al., "Nontemplate Synthesis of CH3NH3PbBr3 Perovskite Nanoparticles", Journal of the American Chemical Society, 2014, vol. 136, No. 3, pp. 850-853 (Publication Dale: Jan. 3, 2014).

Schmidt, L. C. et al., "Nontemplate Synthesis of CH3NH3PbBr3 Perovskite Nanoparticles" Journal of the American Chemical Society, 2014, vol. 136. No. 3, with supplementary information, Jan. 3, 2014, 21 pages.

Smith, Andrew M. et al., "Semiconductor Nanocrystals: Structure, Properties, and Band Gap Engineering", Acc. Chem. Res. 2010, 43, 2, 190-200, Publication Date: Feb. 16, 2010.

Stoumpos, C. C. et al., "Crystal Growth of the Perovskite Semiconductor CsPbBr3: A New Material for High-Energy Radiation Detection", Crystal Growth & Design, 2013, vol. 13, No. 7, pp. 2722-2727.

Suzuki et al., "Optical Band Gap of Barium Titanate Nanoparticles Prepared by RF-plasma Chemical Vapor Deposition", 2005, Jap Journal of Applied Physics, vol. 44, No. 4A, pp. 2081-0282, published Apr. 8, 2005.

Urban, Jeffrey J. et al., "Synthesis of Single-Crystalline Perovskite Nanorods Composed of Barium Titanate and Strontium Titanate", J. Am. Chem. Soc. 2002, 124, 7, 1186-1187, Publication Date:Jan. 29, 2002.

Viteri et al., "Quantum-chemical study of excitons in tetragonal BaTiO3 and SrTiO3 crystals", 2003, Proceedings of SPIE, vol. 5122, pp. 295-302, Feb. 2003.

WIPO, International Search Report of PCT/KR2015/011963 dated on Mar. 10, 2016.

Written Opinion for PCT/KR2015/011957 mailed Mar. 25, 2016.
Written Opinion for PCT/KR2015/011958 mailed Mar. 21, 2016.
Written Opinion for PCT/KR2015/011959 mailed Mar. 14, 2016.
Written Opinion for PCT/KR2015/011963 mailed Mar. 10, 2016.

Yu, Hui et al., "The Role of Chlorine in the Formation Process of 'CH3NH3PbI3-xClx' Perovskite", Advanced Functional Materials, Sep. 5, 2014, vol. 24, No. 45, pp. 7102-7108.

Zhuravleva, Mariya et al., "New single crystal scintillators: CsCaCl3:Eu and CsCaI3:Eu", Journal of Crystal Growth, vol. 352, Issue 1, Aug. 1, 2012, pp. 115-119, Aug. 1, 2012, Elsevier.

* cited by examiner

CORE-SHELL STRUCTURED PEROVSKITE NANOCRYSTALLINE PARTICLE LIGHT-EMITTING BODY, METHOD OF PREPARING THE SAME AND LIGHT EMITTING DEVICE USING THE SAME

TECHNICAL FIELD

The present disclosure relates to a light-emitting body and a light emitting device using the same, and more particularly, to a core-shell structured organic-inorganic hybrid perovskite or inorganic metal halide perovskite nanocrystalline particle light-emitting body, a method of preparing the same and a light emitting device using the same.

BACKGROUND ART

The mega trend of the current display market is moving from an existing highly efficient high-resolution-oriented display to a natural color expression-oriented emotional image display having high color purity. In this regard, while an organic light-emitting body-based organic light emitting diode (OLED) has made great strides until now, alternatively, an inorganic quantum dot LED with improved color purity is being actively researched and developed. However, both of organic light-emitting bodies and inorganic quantum dot light-emitting bodies have intrinsic limitations because of their materials.

The existing organic light-emitting bodies have high efficiency, but do not have high color purity because they exhibit a broad spectrum of emission. Although the inorganic quantum dot light-emitting bodies have been known to have high color purity, since light emission is caused by a quantum dot size effect, it is difficult to control quantum dots to have a uniform size as they approach blue, and thus the color purity is degraded. Moreover, since inorganic quantum dots have a very deep valence band, a hole injection barrier is very high in an organic hole injection layer, and thus hole injection is difficult to perform. In addition, the prices of the two types of light-emitting bodies are high. Therefore, there is a need for new-type organic-inorganic hybrid light-emitting bodies which can compensate for such disadvantages of the organic and inorganic light-emitting bodies and sustain their advantages.

Organic-inorganic hybrid materials have academically and industrially attracted attention because they have low production costs, simple preparation and device manufacturing processes, and easily adjustable optical and electrical properties, which are advantages of organic materials, and have high charge mobility and mechanical and thermal stabilities.

Among these, organic-inorganic hybrid perovskites have high color purity, facilitate color adjustment, and have low synthesis costs, and thus have enormous potential for development as light-emitting bodies. The high color purity (full width at half maximum (FWHM≈20 nm) is achieved because a layered structure is formed by disposing the two dimensional (2D) plane of an inorganic material between the two-dimensional planes of organic materials, and due to a large difference in dielectric constant between the inorganic material and the organic material (corganic≈2.4, cinorganic≈6.1), excitons are confined in the inorganic layer.

Materials having the conventional perovskite structure (ABX$_3$) are inorganic metal oxides.

Such inorganic metal oxides are substances, generally, oxides, in which cations of a metal (an alkali metal, an alkali earth metal, a transition metal or a lanthanide group) such as Ti, Sr, Ca, Cs, Ba, Y, Gd, La, Fe or Mn are located at either the A or B site, the cations having different sizes, and oxygen anions are located at the X site, and the metal cations at the B site are bound with the oxygen anions at the X site in corner-sharing octahedral 6-fold coordination. As an example of such an inorganic metal oxide, there is SrFeO$_3$, LaMnO$_3$, or CaFeO$_3$.

On the other hand, the organic-inorganic hybrid perovskites have an ABX$_3$ structure, in which organic ammonium (RNH$_3$) cations are located at the A site, and halides (Cl, Br and I) are located at the X site, thereby forming an organic metal halide perovskite material. Therefore, the composition of the organic metal halide perovskite material is completely different from that of the inorganic metal oxides perovskite material.

In addition, characteristics of the material also vary according to the difference in composition. Since the inorganic metal oxide perovskites typically exhibit superconductivity, ferroelectricity, and colossal magnetoresistance, they have generally been applied to sensors, fuel cells, memory devices and the like and studied. For example, yttrium barium copper oxide has a superconducting or insulating property depending on oxygen content.

Meanwhile, the organic-inorganic hybrid perovskites (or organic metal halide perovskites) have a structure in which an organic plane and an inorganic plane are alternately laminated, which is similar to a lamella structure, and therefore exciton trapping can occur in the inorganic plane. For this reason, such an organic-inorganic hybrid perovskite can serve as an ideal light-emitting body which emits light with very high color purity essentially because of its crystal structure, rather than its size.

When an organic-inorganic hybrid perovskite includes organic ammonium as a central metal and chromophores (generally including a conjugated structure) with a band gap narrower than that of a halogen crystal structure (BX3), since light emission occurs in the organic ammonium, high color-purity light cannot be emitted, and thus the FWHM of a light emission spectrum is widened to more than 50 nm, indicating that it is not suitable as a light emitting layer. For this reason, this case is not very suitable for a high color-purity light-emitting body which is highlighted in the present invention. Accordingly, to prepare a high color-purity light-emitting body, it is important that organic ammonium does not include a chromophore and light emission in an inorganic lattice composed of a central metal and halogen elements is allowed. In other words, the present invention is focusing on the development of a high color-purity and high efficiency light-emitting body in which light emission occurs in an inorganic lattice. For example, in Korean Unexamined Patent Application No. 10-2001-0015084 (Feb. 26, 2001), an electroluminescent device using a dye-containing organic-inorganic hybrid substance, formed in the form of a film, not particles, as a light emitting layer is disclosed, but in this device, light emission does not occur in a perovskite lattice structure. However, since the organic-inorganic hybrid perovskite has low exciton binding energy, light emission can occur at a low temperature, but it has fundamental problem in which excitons cannot emit light due to thermal ionization and delocalization of charge carriers at room temperature, resulting in separation as free charges and annihilation. Moreover, when free charges are recombined to form excitons, light emission may not occur because the excitons are annihilated by a peripheral layer with high conductivity. Therefore, it is necessary to prevent quenching of excitons in order to increasing emission efficiency and luminance of an organic-inorganic hybrid perovskite-based LED.

DISCLOSURE

Technical Problem

The present invention is directed to providing a nanocrystalline particle light-emitting body which is improved in emission efficiency and durability-stability by synthesizing an organic-inorganic hybrid perovskite as a nanocrystal, rather than a film, in order to prevent thermal ionization, delocalization of charge carriers and quenching of excitons, and a light emitting device using the same.

The present invention is also directed to providing a nanocrystalline particle light-emitting body having improved emission efficiency and durability by forming a shell around a perovskite nanocrystal to form a core-shell structure, and a light emitting device using the same.

Technical Solution

In one aspect, the present invention provides a core-shell structured organic-inorganic hybrid perovskite nanocrystalline particle light-emitting body. The core-shell structured organic-inorganic hybrid perovskite nanocrystalline particle light-emitting body is able to be dispersed in an organic solvent, and has a perovskite nanocrystal structure and a core-shell structured nanocrystalline particle structure.

The organic solvent may be a protic or aprotic solvent, and the protic solvent may be dimethylformamide, gamma butyrolactone, N-methylpyrrolidone or dimethylsulfoxide, and the aprotic solvent may be dichloroethylene, trichloroethylene, chloroform, chlorobenzene, dichlorobenzene, styrene, dimethylformamide, dimethylsulfoxide, xylene, toluene, cyclohexene or isopropylalcohol.

The organic-inorganic hybrid perovskite nanocrystalline particle may have a spherical, cylindrical, elliptic cylindrical or polygonal cylindrical shape.

In the core-shell structured organic-inorganic hybrid perovskite nanocrystalline particle light-emitting body, an organic-inorganic hybrid perovskite nanocrystalline particle size may be 1 nm to 900 nm.

Band gap energy of the organic-inorganic hybrid perovskite nanocrystalline particle is determined by the crystal structure, not by the particle size.

The core-shell structured organic-inorganic hybrid perovskite nanocrystalline particle may include a core including a first organic-inorganic hybrid perovskite nanocrystal, and a shell which surrounds the core and includes a substance with a wider band gap than that of the first organic-inorganic hybrid perovskite.

The first organic-inorganic hybrid perovskite nanocrystal has a 2D or 3D structure.

The first organic-inorganic hybrid perovskite has a structure of $ABX_3$, $A_2BX_4$, $ABX_4$ or $A_{n-1}Pb_nI_{3n+1}$ (n is an integer of 2 to 6), in which A is an organic ammonium substance, B is a metal substance, and X is a halogen element. A may be $(CH_3NH_3)_n$, $((C_xH_{2x+1})_nNH_3)_2(CH_3NH_3)n$, $(RNH_3)_2$, $(C_nH_{2n+1}NH_3)_2$, $(CF_3NH_3)$, $(CF_3NH_3)_n$, $((C_xF_{2x+1})_nNH_3)_2$ $(CF_3NH_3)_n$, $((C_xF_{2x+1})_nNH_3)_2$ or $(CnF_{2n+1}NH_3)_2$ (n is an integer of 1 or higher, and x is an integer of 1 or higher), B may be a divalent transition metal, a rare earth metal, an alkali earth metal, Pb, Sn, Ge, Ga, In, Al, Sb, Bi, Po or a combination thereof, and X may be Cl, Br, I or a combination thereof.

The shell may include a second organic-inorganic perovskite material. Alternatively, the shell may include an organic-inorganic hybrid perovskite nanocrystal which is a second substance, other than an organic-inorganic perovskite material.

The shell may include an inorganic semiconductor, an organic polymer substance or an organic low-molecular-weight substance.

The shell may include a substance having a broad energy band gap, compared to that of the organic-inorganic perovskite substance present in the core.

The inorganic semiconductor substance may be an oxide semiconductor such as $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or $MoO_x$), iron oxide, chromium oxide, bismuth oxide, indium-gallium zinc oxide (IGZO), $ZrO_2$, nickel oxide (NiO), copper (II) oxide (CuO), copper aluminum oxide (CAO, $CuAlO_2$) or zinc rhodium oxide (ZRO, $ZnRh_2O_4$); hydrogen sulfide ($H_2S$), cadmium sulfide (CdS), carbon disulfide ($CS_2$), lead sulfide (PbS), molybdenum disulfide ($MoS_2$), silver sulfide ($Ag_2S$), sodium sulfide ($Na_2S$), zinc sulfide (ZnS), mercury sulfide (HgS), arsenic sulfide (AsS), polyphenylenesulfide ($C_6H_4S$), selenium sulfide ($SeS_2$), or iron disulfide ($FeS_2$).

The organic polymer substance may be a conjugated polymer, such as polyfluorene, poly(p-phenylene), poly (spirofluorene) or a derivative thereof; or a non-conjugated polymer, such as poly(methyl methacrylate) (PMMA), poly (N-vinylcarbazole) (PVK), polyethylene glycol, polyethylene oxide, polyvinylpyrrolidone, polyethyleneimine or polyvinylalcohol (PVA). The organic polymer substance may be any one of all types of conjugated and non-conjugated polymers, and is not limited by a specific chemical structure.

The organic low-molecular-weight substance may be a conjugated substance, such as 4,4'-bis(N-carbazolyl)-1,1"-biphenyl (CBP), 2,8-bis(diphenylphosphoryl)dibenzo[b,d] thiophene (PPT) or N,N-dicarbazolyl-3,5-benzene (mCP). The organic low-molecular-weight substance may be any one of all types of conjugated and non-conjugated low-molecular-weight substances, and is not limited by a specific chemical structure.

In addition, the organic-inorganic hybrid perovskite nanocrystalline particle may further include a plurality of organic ligands surrounding the shell. The organic ligand may include an alkyl halide. The alkyl structure of the alkyl halide may include an acyclic alkyl having a $C_nH_{2n+1}$ structure, a primary alcohol, a secondary alcohol, a tertiary alcohol, an alkylamide, a p-substituted aniline, a phenyl ammonium or fluorine ammonium.

In addition, a surfactant having a carboxylic acid (COOH), such as 4,4'-azobis(4-cyanovaleric acid), acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid or oleic acid may be included, but the present invention is not limited thereto.

In another aspect, the present invention provides a core-shell structured metal halide perovskite nanocrystalline particle light-emitting body. The core-shell structured metal halide perovskite nanocrystalline particle light-emitting body may be dispersed in an organic solvent, and may have a perovskite nanocrystal structure and a core-shell structured nanocrystalline particle structure.

In still another aspect, the present invention provides a solar cell. Such a solar cell may include a first electrode, a second electrode, and a photoactive layer disposed between the first electrode and the second electrode and including the above-described core-shell structured perovskite nanocrystalline particle.

In addition, the core-shell structured metal halide perovskite nanocrystalline particle may include a core including a first metal halide perovskite nanocrystal; and a shell which surrounds the core and has a substance having a wider band gap than that of the first metal halide perovskite.

In addition, the first metal halide perovskite has a structure of $ABX_3$, $A_2BX_4$, $ABX_4$ or $A_{n-1}Pb_nI_{3n+1}$ (n is an integer of 2 to 6), in which A is an alkali metal substance, B is a metal substance, and X is a halogen element.

In addition, A is Na, K, Rb, Cs or Fr.

A plurality of organic ligands surrounding the shell may be further included.

In yet another aspect, the present invention provides a method of preparing a core-shell structured organic-inorganic hybrid perovskite nanocrystalline particle light-emitting body. The method of preparing a core-shell structured organic-inorganic hybrid perovskite nanocrystalline particle light-emitting body may include preparing a first solution by dissolving first organic-inorganic hybrid perovskite in a protic solvent and a second solution by dissolving a surfactant in an aprotic solvent; forming a core including a first organic-inorganic hybrid perovskite nanocrystal by mixing the first solution with the second solution; and forming a shell surrounding the core and including a second organic-inorganic hybrid perovskite nanocrystal or an inorganic semiconductor substance by adding a third solution in which a second organic-inorganic hybrid perovskite or inorganic semiconductor substance having a wider band gap than that of the first organic-inorganic hybrid perovskite is dissolved to the second solution.

In yet another aspect, the present invention provides a method of preparing a core-shell structured organic-inorganic hybrid perovskite nanocrystalline particle light-emitting body. The method of preparing a core-shell structured organic-inorganic hybrid perovskite nanocrystalline particle light-emitting body may include preparing a first solution by dissolving a first organic-inorganic hybrid perovskite in a protic solvent and a second solution by dissolving a surfactant in an aprotic solvent; forming a core including a first organic-inorganic hybrid perovskite nanocrystal by mixing the first solution with the second solution; and forming a shell surrounding the cores and having a wider band gap than that of the core, by adding an organic ammonium halide solution to the second solution and then stirring the resulting solution.

In yet another aspect, the present invention provides a method of preparing a core-shell structured organic-inorganic hybrid perovskite nanocrystalline particle light-emitting body. The method of preparing a core-shell structured organic-inorganic hybrid perovskite nanocrystalline particle light-emitting body may include preparing a first solution by dissolving a first organic-inorganic hybrid perovskite in a protic solvent and a second solution by dissolving a surfactant in an aprotic solvent; forming a core including a first organic-inorganic hybrid perovskite nanocrystal by mixing the first solution with the second solution; thermally decomposing a surface of the core by thermally treating the second solution; and forming a shell, which surrounds the core and has a wider band gap than that of the core, by adding an organic ammonium halide solution to the thermally-treated second solution.

In yet another aspect, the present invention provides a light emitting device. Such a light emitting device may include a first electrode; a second electrode; and a light emitting layer which is disposed between the first electrode and the second electrode and includes the above-described core-shell structured organic-inorganic hybrid perovskite nanocrystalline particle light-emitting body or core-shell structured inorganic metal halide perovskite nanocrystalline particle light-emitting body.

Advantageous Effects

A nanocrystalline particle light-emitting body including an organic-inorganic hybrid perovskite nanocrystal or inorganic metal halide perovskite nanocrystal according to the present invention can form an organic-inorganic hybrid perovskite or inorganic metal halide perovskite, which has a crystalline structure of a combination of FCC and BCC in the nanocrystalline particle light-emitting body, can form a lamella structure in which an organic plane and an inorganic plane are alternately laminated, and can exhibit high color purity by trapping excitons in the inorganic plane.

In addition, exciton annihilation caused by thermal ionization and delocalization of charge carriers can be prevented by a decrease in exciton diffusion length and an increase in exciton binding energy in the nanocrystals with a size of 900 nm or less, resulting in high emission efficiency at room temperature.

In addition, the band gap energy of the organic-inorganic hybrid perovskite nanocrystalline particle or inorganic metal halide perovskite nanocrystalline particle is determined by the perovskite crystal structure, unlike the inorganic quantum dot light-emitting body depending on a particle size.

In addition, compared to a 3D organic-inorganic hybrid perovskite, a 2D organic-inorganic hybrid perovskite is synthesized as a nanocrystal, thereby further improving emission efficiency due to the increase in exciton binding energy and increasing durability-stability.

Moreover, in the core-shell structured organic-inorganic hybrid perovskite nanocrystalline particle light-emitting body or inorganic metal halide perovskite nanocrystalline particle light-emitting body formed according to the present invention, a shell is formed of a substance having a wide band gap than that of the core to allow excitons to be more strongly confined in the core, and to prevent exposure of the core perovskite in the air using stable perovskite or inorganic semiconductor in the air or an organic polymer, resulting in improvement in the durability of the nanocrystal.

The technical effects of the present invention are not limited as described above, and other technical effects that have not been described will be clearly understood to those of ordinary skill in the art from descriptions as below.

MODES OF THE INVENTION

Hereinafter, examples of the present invention will be described in detail with reference to the accompanying drawings as below.

The present invention may have various modifications and alternative forms, and specific examples will be illustrated in detail with reference to the accompanying drawings below. However, the present invention is not limited to the particular forms disclosed herein, and rather includes all of modifications, equivalents and substitutions consistent with the spirit of the present invention defined by the claims.

When an element such as a layer, region or substrate is referred to as being present "on" another element, it will be understood that the element may be directly present on another element, or a third element may be present therebetween.

Although the terms "first," "second," etc. may be used to describe various elements, components, regions, layers and/or areas, it is to be understood that such elements, components, regions, layers and/or areas should not be limited by these terms.

An organic-inorganic hybrid perovskite nanocrystalline particle according to an exemplary embodiment of the present invention will be described.

The organic-inorganic hybrid perovskite nanocrystalline particle according to an exemplary embodiment of the present invention may be dispersed in an organic solvent and include a perovskite nanocrystal structure.

Figure 1:
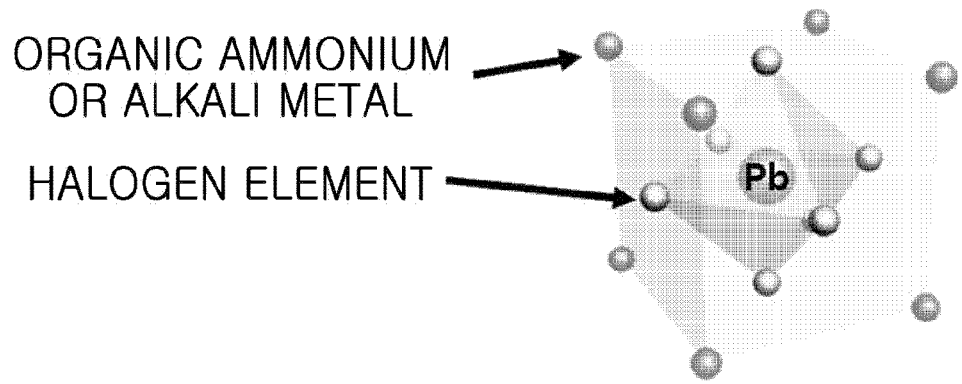
FIG. 1 is a schematic diagram of a perovskite nanocrystal structure according to an exemplary embodiment of the present invention.

FIG. 1 shows a perovskite nanocrystal structure according to an exemplary embodiment of the present invention.

FIG. 1 shows structures of both of organic-inorganic hybrid perovskite nanocrystals and inorganic metal halide perovskite nanocrystals.

Referring to FIG. 1, the organic-inorganic hybrid perovskite nanocrystal includes a central metal located in the middle, and has a face centered cubic (FCC) structure in which six inorganic halide substances (X) are located on all hexahedral sides and a body centered cubic (BCC) structure in which eight organic ammonium (OA) elements are located at all hexahedral vertices. As an example, the central metal used herein is Pb.

In addition, the inorganic metal halide perovskite nanocrystal includes a central metal located in the middle, and has an FCC structure in which six inorganic halide substances (X) are located on all hexahedral sides and a BCC structure in which eight alkali metal elements are located at all hexahedral vertices. As an example, the central metal used herein is Pb.

Here, the structures include a cubic structure in which all hexahedral sides make an angle of 90 degrees with each other, and the width, the length and the height are the same as each other, and a tetragonal structure in which the width and the length are the same as each other, but the height is different from the others.

Accordingly, a 2D structure according to the present invention is an organic-inorganic hybrid perovskite nanocrystal structure, which includes a central metal in the middle, and has a FCC in which six inorganic halide substances are located on all hexahedral sides and a BCC in which eight organic ammonium elements are located at all hexahedral vertices, and is defined as a structure in which the width and the length are the same as each other, but the height is 1.5-fold longer than the width and the length.

A method of preparing a core-shell structured organic-inorganic hybrid perovskite nanocrystalline particle light-emitting body according to an exemplary embodiment of the present invention will be described.

Figure 2:
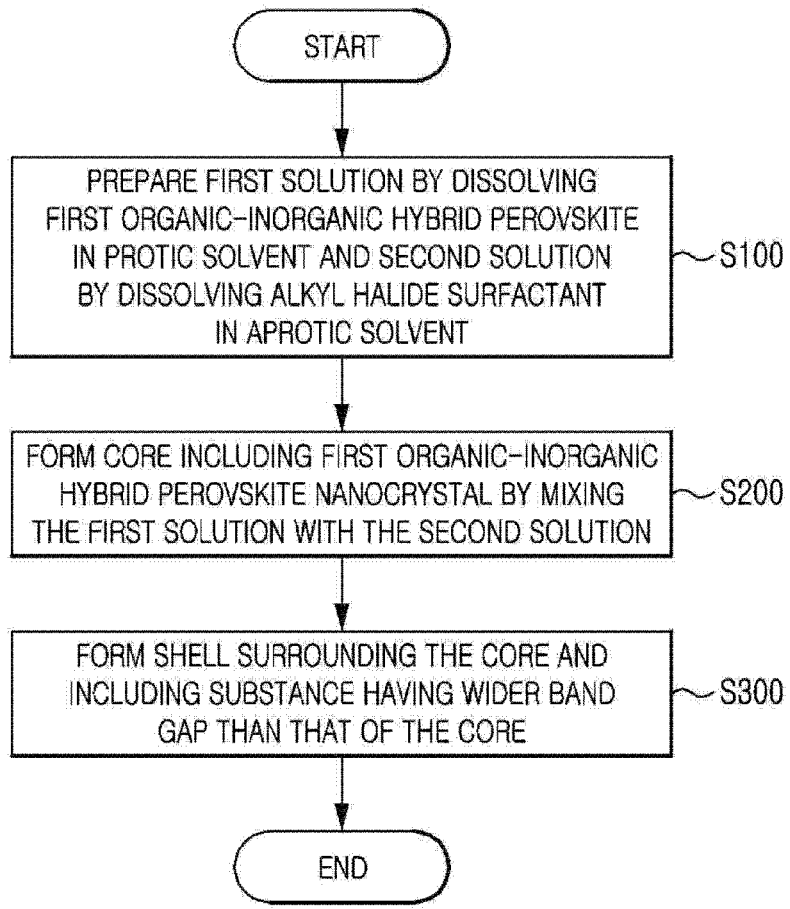
FIG. 2 is a flowchart illustrating a method of preparing a core-shell structured organic-inorganic hybrid perovskite nanocrystalline particle light-emitting body according to an exemplary embodiment of the present invention.

FIG. 2 is a flowchart illustrating a method of preparing a core-shell structured organic-inorganic hybrid perovskite nanocrystalline particle light-emitting body according to an exemplary embodiment of the present invention.

Referring to FIG. 2, the method of preparing a core-shell structured organic-inorganic hybrid perovskite nanocrystalline particle light-emitting body according to the present invention includes preparing a first solution by dissolving a first organic-inorganic hybrid perovskite in a protic solvent and a second solution by dissolving a surfactant in an aprotic solvent (S100), forming a core including a first organic-inorganic hybrid perovskite nanocrystal by mixing the first solution with the second solution (S200) and forming a shell surrounding the core and including a substance having a wider band gap than that of the core (S300).

In further detail, first, a first solution in which a first organic-inorganic hybrid perovskite is dissolved in a protic solvent and a second solution in which a surfactant is dissolved in an aprotic solvent are prepared (S100).

Here, the protic solvent may be dimethylformamide, gamma butyrolactone, N-methylpyrrolidone, or dimethylsulfoxide, but the present invention is not limited thereto.

Here, the first organic-inorganic hybrid perovskite nanocrystal has a 2D or 3D structure.

For example, the organic-inorganic hybrid perovskite having a 3D crystalline structure may be an $ABX_3$ structure. In addition, the organic-inorganic hybrid perovskite having a 2D crystalline structure may be an $ABX_3$, $A_2BX_4$, $ABX_4$ or $A_{n-1}Pb_nI_{3n+1}$ (n is an integer of 2 to 6) structure.

Here, A is an organic ammonium substance, B is a metal substance, and X is a halogen element.

For example, A may be $(CH_3NH_3)_n$, $((C_xH_{2x+1})_nNH_3)_2(CH_3NH_3)n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ or $(C_nF_{2n+1}NH_3)_2$ (n is an integer of 1 or higher, and x is an integer of 1 or higher), B may be a divalent transition metal, a rare earth metal, an alkali earth metal, Pb, Sn, Ge, Ga, In, Al, Sb, Bi, Po or a combination thereof, and X may be Cl, Br, I or a combination thereof. Here, the rare earth metal may be, for example, Ge, Sn, Pb, Eu or Yb. In addition, the alkali earth metal may be, for example, Ca or Sr.

Meanwhile, such a perovskite may be prepared by combining AX and $BX_2$ in a certain ratio. That is, the first solution may be prepared by dissolving AX and $BX_2$ in a protic solvent at a certain ratio. For example, a first solution may be prepared in which an $A_2BX_3$ organic-inorganic hybrid perovskite is dissolved by dissolving AX and $BX_2$ in a protic solvent at a ratio of 2:1.

In addition, the organic-inorganic hybrid perovskite more preferably employs a substance having a 2D crystalline structure, rather than a 3D crystalline structure.

This is because, when the organic-inorganic hybrid perovskite having a 2D structure, relative to that having a 3D structure, is prepared as a nanocrystal, excitons may be more dominantly confined to an inorganic plane by an organic plane due to a clear distinction between the inorganic plane and the organic plane, which are laminated, thereby increasing exciton binding energy, improving emission efficiency, increasing durability-stability, and exhibiting higher color purity.

In addition, the aprotic solvent may be dichloroethylene, trichloroethylene, chloroform, chlorobenzene, dichlorobenzene, styrene, dimethylformamide, dimethylsulfoxide, xylene, toluene, cyclohexene or isopropylalcohol, but the present invention is not limited thereto.

In addition, the surfactant may be an alkyl halide surfactant having an alkyl-X structure. Here, a halogen element corresponding to X may be Cl, Br or I. In addition, as the alkyl moiety, an acyclic alkyl having a $C_nH_{2n+1}$ structure, a primary alcohol having, for example, a $C_nH_{2n+1}OH$ structure, a secondary alcohol, a tertiary alcohol, an alkyl amine having an alkyl-N structure (e.g., hexadecyl amine, 9-octadecenylamine 1-amino-9-octadecene ($C_{19}H_{37}N$)), p-substituted aniline, phenyl ammonium or fluorine ammonium may be employed, but the present invention is not limited thereto.

In addition, the surfactant may contain a carboxylic acid (COOH), such as 4,4'-azobis(4-cyanovaleric acid), acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid or oleic acid, but the present invention is not limited thereto.

Next, the first solution is mixed with the second solution, thereby forming a core including a first organic-inorganic hybrid perovskite nanocrystal (S200).

The formation of a core by mixing the first solution with the second solution is preferably carried out by adding the first solution to the second solution dropwise. In addition, the second solution may be subjected to stirring. For example, a second solution in which an organic-inorganic hybrid perovskite (OIP) is dissolved may be slowly added dropwise to the second solution in which an alkyl halide surfactant is dissolved while harshly stirring, thereby synthesizing the core including a first organic-inorganic hybrid perovskite nanocrystal.

In this case, when the first solution is dropped and mixed into the second solution, due to a difference in solubility, the organic-inorganic hybrid perovskite (OIP) is precipitated from the second solution. In addition, as a surface of the organic-inorganic hybrid perovskite (OIP) precipitated from the second solution is stabilized by the alkyl halide surfactant, a uniformly-dispersed organic-inorganic perovskite nanocrystal (OIP-NC) core is generated. Therefore, in this case, the generated organic-inorganic perovskite nanocrystal is surrounded by a plurality of alkyl halide organic ligands.

Meanwhile, a size of the organic-inorganic hybrid perovskite nanocrystal may be controlled by adjustment of a length or shape factor of the alkyl halide surfactant. For example, the shape factor adjustment may facilitate size control by a linear, tapered or inversed triangular surfactant.

In addition, such an organic-inorganic perovskite nanocrystalline particle may have a size of 1 nm to 900 nm. Meanwhile, the nanocrystalline particle size refers to a size not allowing for the length of a ligand which will be described below, that is, a size of the particle excluding such a ligand.

If the size of the organic-inorganic perovskite nanocrystalline particle exceeds 900 nm, there may be a fundamental problem in which excitons are not emitted but separated into free charges due to thermal ionization and delocalization of charge carriers in such a large nanocrystal, resulting in annihilation.

Subsequently, a shell surrounding the core and including a substance having a wider bond gap than that of the core is formed (S300).

For example, the shell may include a second organic-inorganic hybrid perovskite material. Alternatively, the shell may include an inorganic semiconductor or an organic polymer substance.

For example, a solution in which a second organic-inorganic hybrid perovskite, an inorganic semiconductor substance, an organic polymer substance or an organic low-molecular-weight substance, which has a wider band gap than that of the first organic-inorganic hybrid perovskite, is dissolved is added to the second solution, thereby forming a shell surrounding the core, which includes a second organic-inorganic hybrid perovskite nanocrystal, an inorganic semiconductor substance, an organic polymer substance or an organic low-molecular-weight substance.

The second organic-inorganic hybrid perovskite preferably employs a substance having a wider band gap than that of the first organic-inorganic hybrid perovskite. Such a second organic-inorganic hybrid perovskite may have an $ABX_3$, $A_2BX_4$, $ABX_4$ or $A_{n-1}Pb_nI_{3n+1}$ (n is an integer of 2 to 6) structure. Here, A is an organic ammonium substance, B is a metal substance, and X is a halogen element.

For example, A may be $(CH_3NH_3)_n$, $((C_xH_{2x+1})_nNH_3)_2$ $(CH_3NH_3)n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ or $(C_nF_{2n+1}NH_3)_2$ (n is an integer of 1 or higher, and x is an integer of 1 or higher), B may be a divalent transition metal, rare earth metal, alkali earth metal, Pb, Sn, Ge, Ga, In, Al, Sb, Bi, Po or a combination thereof, and X may be Cl, Br, I or a combination thereof. The rare earth metal may be, for example, Ge, Sn, Pb, Eu or Yb. Also, the alkali earth metal may be, for example, Ca or Sr.

The inorganic semiconductor substance may be an oxide semiconductor such as $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or $MoO_x$), iron oxide, chromium oxide, bismuth oxide, indium-gallium zinc oxide (IGZO), $ZrO_2$, nickel oxide (NiO), copper (II) oxide (CuO), copper aluminum oxide (CAO, $CuAlO_2$) or zinc rhodium oxide (ZRO, $ZnRh_2O_4$).

Alternatively, the inorganic semiconductor substance may be, for example, hydrogen sulfide ($H_2S$), cadmium sulfide (CdS), carbon disulfide ($CS_2$), lead sulfide (PbS), molybdenum disulfide ($MoS_2$), silver sulfide ($Ag_2S$), sodium sulfide ($Na_2S$), zinc sulfide (ZnS), mercury sulfide (HgS), arsenic sulfide (AsS), polyphenylenesulfide ($C_6H_4S$), selenium sulfide ($SeS_2$), or iron disulfide ($FeS_2$).

The organic polymer substance may be a conjugated polymer, such as polyfluorene, poly(p-phenylene), poly(spirofluorene) or a derivative thereof; or a non-conjugated polymer, such as poly(methyl methacrylate) (PMMA), poly(N-vinylcarbazole) (PVK), polyethylene glycol, polyethylene oxide, polyvinylpyrrolidone, polyethyleneimine or polyvinylalcohol (PVA). The organic polymer substance may be any one of all types of conjugated and non-conjugated polymers, and is not limited by a specific chemical structure.

The organic low-molecular-weight substance may be a conjugated substance, such as 4,4'-bis(N-carbazolyl)-1,1''-biphenyl (CBP), 2,8-bis(diphenylphosphoryl)dibenzo[b,d]thiophene (PPT) or N,N-dicarbazolyl-3,5-benzene (mCP). The organic low-molecular-weight substance may be any one of all types of conjugated and non-conjugated low-molecular-weight substances, and is not limited by a specific chemical structure.

Figure 3:
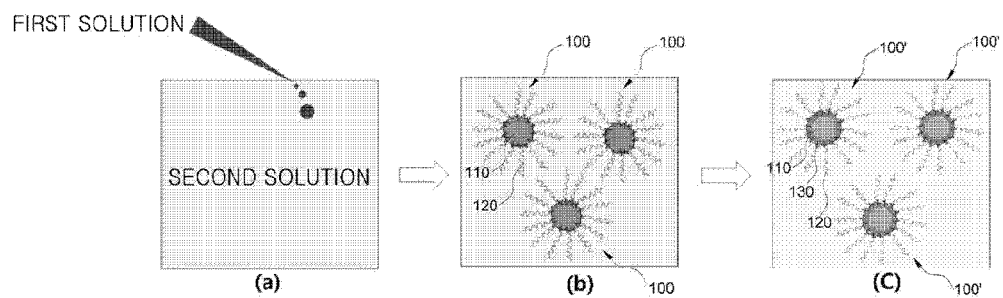
FIG. 3 is a schematic diagram illustrating a method of preparing a core-shell structured organic-inorganic hybrid perovskite nanocrystalline particle light-emitting body according to an exemplary embodiment of the present invention.

FIG. 3 is a schematic diagram illustrating a method of preparing a core-shell structured organic-inorganic hybrid perovskite nanocrystalline particle light-emitting body according to an exemplary embodiment of the present invention.

Referring to FIG. 3(A), a first solution in which an organic-inorganic hybrid perovskite is dissolved in a protic solvent is added dropwise to a second solution in which an alkyl halide surfactant is dissolved in aprotic solvent.

Referring to FIG. 3(B), when the first solution is added to the second solution, due to a difference in solubility, the organic-inorganic hybrid perovskite is precipitated from the second solution, and as the precipitated organic-inorganic hybrid perovskite is stabilized while being surrounded by the alkyl halide surfactant, an organic-inorganic hybrid perovskite nanocrystalline particle light-emitting body 100 including a uniformly-dispersed organic-inorganic hybrid perovskite nanocrystal core 110 is generated. The nanocrystal core 110 is surrounded by alkyl halide organic ligands.

Meanwhile, the organic-inorganic hybrid perovskite nanocrystalline particle light-emitting body composed of the core according to an exemplary embodiment of the present invention will be described first with reference to FIG. 4.

Figure 4:
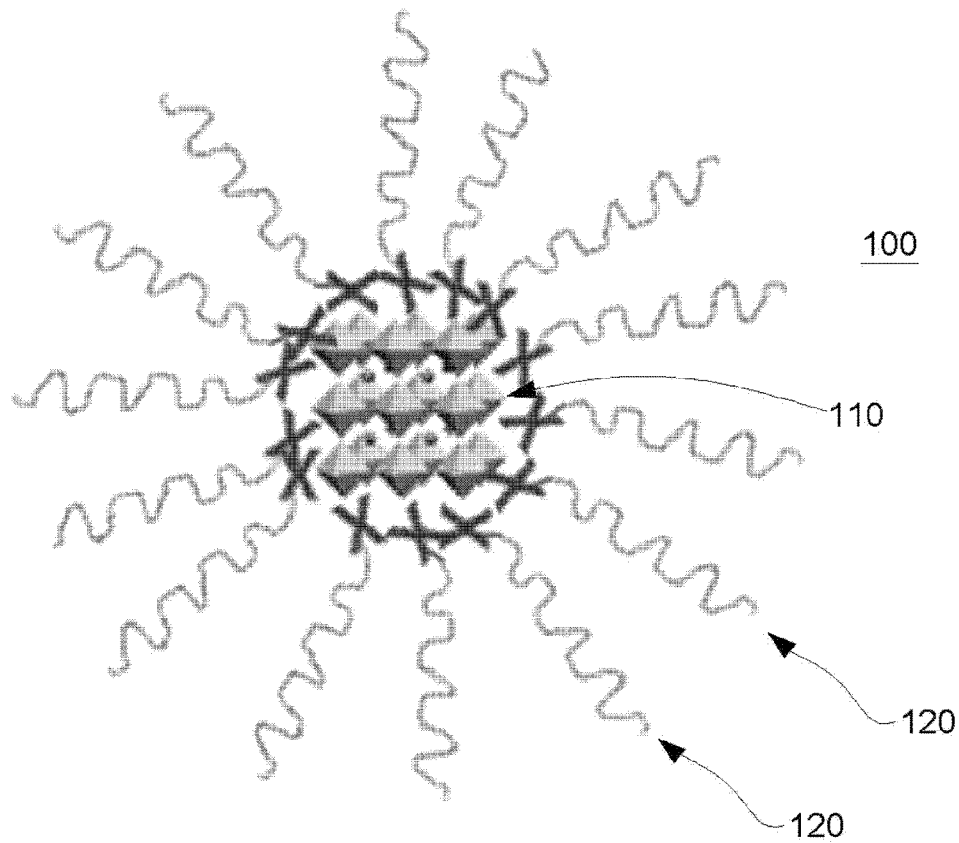
FIG. 4 is a schematic diagram of an organic-inorganic hybrid perovskite nanocrystalline particle light-emitting body and an inorganic metal halide perovskite nanocrystalline particle light-emitting body according to an exemplary embodiment of the present invention.

FIG. 4 is a schematic diagram of an organic-inorganic hybrid perovskite nanocrystalline particle light-emitting body and an inorganic metal halide perovskite nanocrystalline particle light-emitting body according to an exemplary embodiment of the present invention. Here, FIG. 4 illustrates the organic-inorganic hybrid perovskite nanocrystalline particle light-emitting body, and when the organic-inorganic hybrid perovskite of FIG. 4 is changed to an inorganic metal halide perovskite, an inorganic metal halide nanocrystalline particle light-emitting body is generated, and a description thereof is the same as described above.

Referring to FIG. 4, the light-emitting body according to an exemplary embodiment of the present invention, as an organic-inorganic hybrid perovskite nanocrystalline particle light-emitting body or an inorganic metal halide perovskite nanocrystalline particle light-emitting body, includes an organic-inorganic hybrid perovskite nanocrystal structure or inorganic metal halide perovskite nanocrystal structure 110, which can be dispersed in an organic solvent. Such a nanocrystal structure 110 serves as a nanocrystal core of the light-emitting body according to the present invention.

In addition, the organic-inorganic hybrid perovskite or inorganic metal halide perovskite may be a substance having a 3D crystalline structure or a 2D crystalline structure.

For example, an organic-inorganic hybrid perovskite having a 3D crystalline structure may have an $ABX_3$ structure. In addition, an organic-inorganic hybrid perovskite having a 2D crystalline structure may have an $ABX_3$, $A_2BX_4$, $ABX_4$ or $A_{n-1}Pb_nI_{3n+1}$ (n is an integer of 2 to 6) structure.

Here, A may be $(CH_3NH_3)_n$, $((C_xH_{2x+1})_nNH_3)_2(CH_3NH_3)$ n, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ or $(C_nF_{2n+1}NH_3)_2$ (n is an integer of 1 or higher), B may be a divalent transition metal, a rare earth metal, an alkali earth metal, Pb, Sn, Ge, Ga, In, Al, Sb, Bi, Po or a combination thereof, and X may be Cl, Br, I or a combination thereof. The rare earth metal may be, for example, Ge, Sn, Pb, Eu or Yb. Also, the alkali earth metal may be, for example, Ca or Sr.

For example, an inorganic metal halide perovskite having a 3D crystalline structure may have an $ABX_3$ structure. In addition, an inorganic metal halide perovskite having a 2D crystalline structure may have an $ABX_3$, $A_2BX_4$, $ABX_4$ or $A_{n-1}Pb_nI_{3n+1}$ (n is an integer of 2 to 6) structure.

Here, A may be an alkali metal, B may be a divalent transition metal, a rare earth metal, an alkali earth metal, Pb, Sn, Ge, Ga, In, Al, Sb, Bi, Po or a combination thereof, and X may be Cl, Br, I or a combination thereof. The rare earth metal may be, for example, Ge, Sn, Pb, Eu or Yb. Also, the alkali earth metal may be, for example, Ca or Sr.

Meanwhile, the organic-inorganic hybrid perovskite nanocrystalline particle light-emitting body 100 according to the present invention may further include a plurality of organic ligands 120 which surround the above-described organic-inorganic hybrid perovskite nanocrystal core 110.

Such an organic ligand 120 may include an alkyl halide. For example, the alkyl halide may have an alkyl-X structure. A halogen element corresponding to X may be Cl, Br or I. In addition, as the alkyl moiety, an acyclic alkyl having a $C_nH_{2n+1}$ structure, a primary alcohol having, for example, a $C_nH_{2n+1}OH$ structure, a secondary alcohol, a tertiary alcohol, an alkylamine having an alkyl-N structure (ex. hexadecyl amine, 9-octadecenylamine 1-amino-9-octadecene ($C_{19}H_{37}N$)), p-substituted aniline, phenyl ammonium or fluorine ammonium may be employed, but the present invention is not limited thereto.

Referring to FIG. 3(C) again, a shell 130 surrounding the core 110 and including a substance having a wider band gap than that of the core 110 may be formed.

Meanwhile, a core-shell structure according to an exemplary embodiment of the present invention will be described first with reference to FIG. 5.

The core-shell structured organic-inorganic hybrid perovskite nanocrystalline particle light-emitting body according to an exemplary embodiment of the present invention is able to be dispersed in an organic solvent, and has a perovskite nanocrystal structure and a core-shell structured nanocrystalline particle structure. The organic solvent may be a protic solvent or an aprotic solvent.

In addition, the nanocrystalline particle may be formed in a spherical, cylindrical, elliptic cylindrical or polygonal cylindrical shape.

In addition, the size of such a nanocrystalline particle may be 1 nm to 900 nm. Meanwhile, the nanocrystalline particle size refers to a size not allowing for the length of a ligand which will be described below, that is, a size of the particle excluding such a ligand. For example, when the nanocrystal has a spherical shape, it may have a diameter of 1 nm to 900 nm.

In addition, a plurality of organic ligands which surround such an organic-inorganic hybrid perovskite nanocrystal may be further included.

Figure 5:
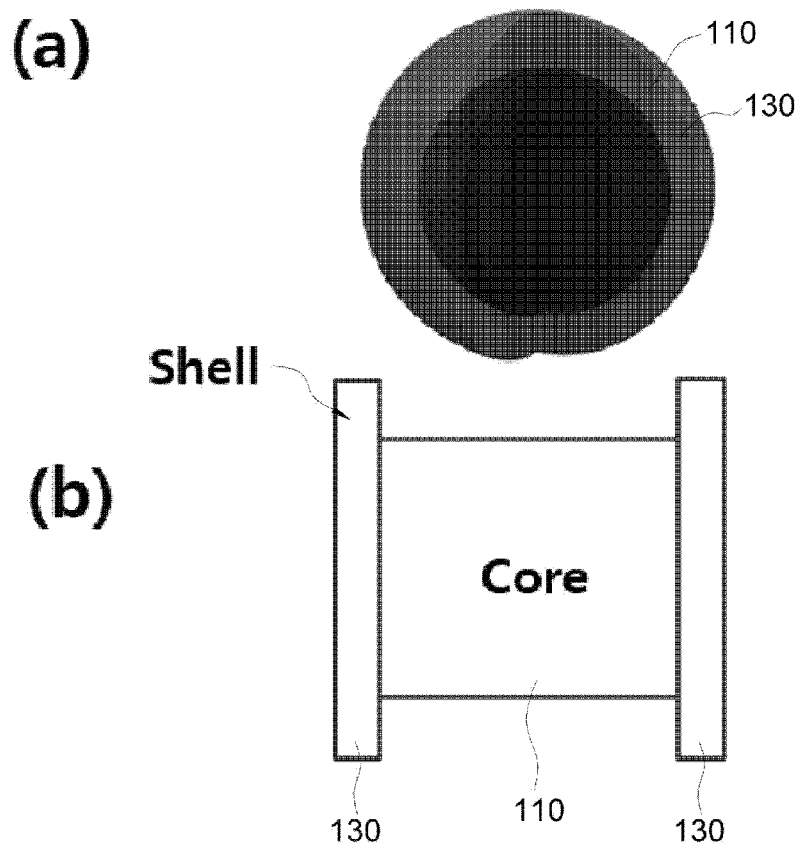
FIG. 5 shows a schematic diagram of a partial section of a core-shell structured organic-inorganic hybrid perovskite nanocrystal according to an exemplary embodiment of the present invention and a band diagram thereof.

FIG. 5 shows a schematic diagram of a core-shell structured organic-inorganic hybrid perovskite nanocrystal according to an exemplary embodiment of the present invention and a band diagram thereof.

Referring to FIG. 5(A), it can be seen that a nanocrystalline particle light-emitting body according to the present invention has a structure including a core 110 and a shell 130 surrounding the core 110. Here, referring to FIG. 5(B), since the energy band gap of the shell is higher than that of the core, excitons may be more strongly confined to the core perovskite.

Again, methods of forming such a shell will be described in detail with reference to FIG. 6.

Figure 6:
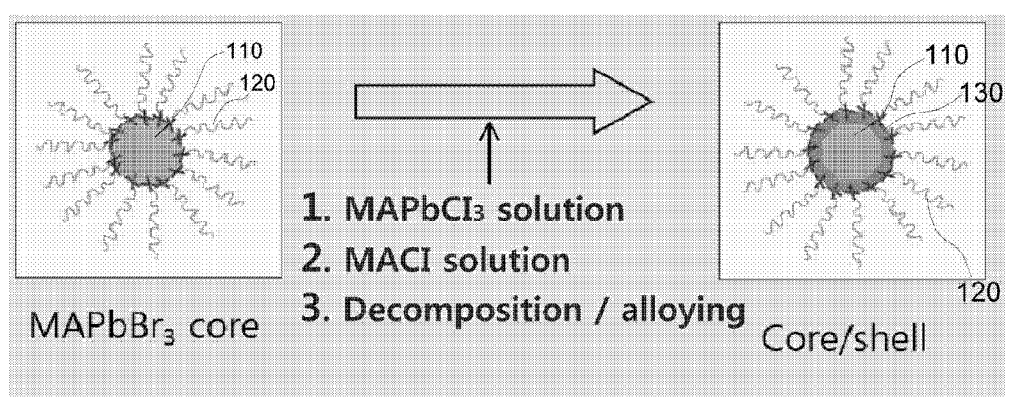
FIG. 6 is a schematic diagram illustrating a method of forming a shell according to an exemplary embodiment of the present invention.

FIG. 6 is a schematic diagram illustrating a method of forming a shell according to an exemplary embodiment of the present invention.

Referring to FIG. 6, first, a first organic-inorganic hybrid perovskite nanocrystal 120 is formed as a core. Here, as the first organic-inorganic hybrid perovskite, MAPbBr$_3$ may be exemplified. Here, MA refers to methylammonium.

A method of forming such a core may be performed by inverse nano-emulsion. For example, the method of forming a core may include preparing a first solution in which a first organic-inorganic hybrid perovskite is dissolved in a protic solvent and a second solution in which an alkyl halide surfactant is dissolved in an aprotic solvent, and forming a core including a first organic-inorganic hybrid perovskite nanocrystal by mixing the first solution with the second solution.

Then, as a method of forming a shell on a surface of such a core, three methods as follows may be used.

As a first method, a shell may be formed using a second organic-inorganic hybrid perovskite solution or an inorganic semiconductor solution. That is, a shell including a second organic-inorganic hybrid perovskite nanocrystal or an inorganic semiconductor substance, which surrounds the core, may be formed by adding a third solution in which a second organic-inorganic hybrid perovskite or inorganic semiconductor substance having a wider band gap than that of the first organic-inorganic hybrid perovskite is dissolved to the second solution.

For example, while the organic-inorganic hybrid perovskite (MAPbBr$_3$) solution prepared by the above-described method (inverse nano-emulsion) is harshly stirred, a shell including a second organic-inorganic hybrid perovskite nanocrystal (MAPbCl$_3$) or an inorganic semiconductor substance may be formed by slowly adding an organic-inorganic hybrid perovskite (MAPbCl$_3$) solution having a wider band gap than that of MAPbBr$_3$ or an inorganic semiconductor solution containing, for example, ZnS or a metal oxide dropwise.

This is because the core perovskite is mixed with the shell perovskite, thereby forming an alloy form or exhibiting stickiness, and thus a core-shell structured organic-inorganic hybrid perovskite may be synthesized.

As a result, a MAPbBr$_3$/MAPbCl$_3$ core-shell structured organic-inorganic hybrid perovskite nanocrystalline particle light-emitting body may be formed.

As a second method, a shell may be formed using an organic ammonium halide solution. That is, a large amount of the organic ammonium halide solution may be added to the second solution and then stirred, thereby forming a shell having a wider band gap than that of the core and surrounding the core.

For example, as a MACl solution may be added to the organic-inorganic hybrid perovskite (MAPbBr$_3$) solution prepared by the above-described method (inverse nano-emulsion) and then harshly stirred, MAPbBr$_3$ on the surface is converted into MAPbBr$_{3-x}$Cl$_x$ because of excessive MACl, thereby forming a shell.

As a result, a MAPbBr$_3$/MAPbBr$_{3-x}$Cl$_x$ core-shell structured organic-inorganic hybrid perovskite nanocrystalline particle light-emitting body may be formed.

As a third method, a shell may be formed using thermal decomposition/alloying. That is, after the second solution may be thermally treated to thermally decompose a core surface, a shell having a wider band gap than that of the core, which surrounds the core, may be formed by alloying a surface again by adding an organic ammonium halide solution to the thermally-treated second solution.

For example, after an organic-inorganic hybrid perovskite (MAPbBr$_3$) solution prepared by the above-described method (inverse nano-emulsion) is thermally treated to thermally decompose such that the surface is changed into PbBr$_2$, a shell may be formed by alloying the surface into MAPbBr$_2$Cl again by adding a MACl solution.

That is, MAPbBr$_3$ may be thermally decomposed into MABr and PbBr$_2$ through thermal decomposition.

As a result, a MAPbBr$_3$/MAPbBr$_2$Cl core-shell structured organic-inorganic hybrid perovskite nanocrystalline particle light-emitting body may be formed.

As a fourth method, a shell may be formed using an organic semiconductor solution. That is, a shell including a core including the first organic-inorganic hybrid perovskite nanocrystal and an organic semiconductor substance surrounding the core may be formed by previously dissolving an organic semiconductor substance having a wider band gap than that of the organic-inorganic hybrid perovskite in a second solution, and adding the first solution in which the above-described first organic-inorganic hybrid perovskite is dissolved in the second solution.

Since the organic semiconductor substance tends to be attached to the core perovskite surface, a core-shell structured organic-inorganic hybrid perovskite may be synthesized.

As a result, a MAPbBr$_3$-organic semiconductor core-shell structured organic-inorganic hybrid perovskite nanocrystalline particle light-emitting body may be formed.

As a fifth method, a shell may be formed using selective extraction. That is, a shell having a wider band gap than that of the core, which surrounds the core, may be formed by forming its surface only with $PbBr_2$ by selectively extracting MABr from a nanocrystal surface by adding a small amount of IPA solvent to a second solution in which a core including the first organic-inorganic hybrid perovskite nanocrystal is formed.

For example, a $PbBr_2$ shell may be formed by selectively dissolving and extracting only MABr on the nanocrystal surface to remain only $PbBr_2$ thereon by adding a small amount of IPA to the organic-inorganic hybrid perovskite ($MAPbBr_3$) solution prepared by the above-described method (inverse nano-emulsion).

That is, the MABr on the $MAPbBr_3$ surface may be removed through the selective extraction.

As a result, a $MAPbBr_3$—$PbBr_2$ core-shell structured organic-inorganic hybrid perovskite nanocrystalline particle light-emitting body may be formed.

A core-shell structured inorganic metal halide perovskite nanocrystalline particle light-emitting body according to an exemplary embodiment of the present invention will be described.

The core-shell structured inorganic metal halide perovskite nanocrystalline particle light-emitting body may be dispersed in an organic solvent, and include a perovskite nanocrystal structure and a core-shell structured nanocrystalline particle structure.

Such an inorganic metal halide perovskite nanocrystalline particle light-emitting body is the same as the above-described organic-inorganic hybrid perovskite nanocrystalline particle light-emitting body, except that the organic ammonium substance at the A site is replaced with an alkali metal substance. Here, in the alkali metal substance, for example, A may be Na, K, Rb, Cs or Fr.

For example, the core-shell structured inorganic metal halide perovskite nanocrystalline particle may include
a core including a first inorganic metal halide perovskite nanocrystal and a shell surrounding the core and including a substance having a wider band gap than that of the first inorganic metal halide perovskite. In addition, the first inorganic metal halide perovskite may include an $ABX_3$, $A_2BX_4$, $ABX_4$ or $A_{n-1}Pb_nI_{3n+1}$ (n is an integer of 2 to 6) structure, in which A may be an alkali metal substance, B may be a metal substance, and X may be a halogen element. The core-shell structured inorganic metal halide perovskite nanocrystalline particle may further include a plurality of organic ligands surrounding the shell. In addition, the shell may include a second inorganic halide, an inorganic metal halide perovskite nanocrystal substance, an inorganic semiconductor or an organic polymer substance.

Such a core-shell structured "inorganic metal halide" perovskite nanocrystalline particle has an alkali metal as an A site substance, and a core-shell structured "organic-inorganic hybrid" perovskite nanocrystalline particle is the same as the above one except that an A site substance is an organic ammonium substance. Therefore, details on the core-shell structured inorganic metal halide perovskite nanocrystalline particle and the method of preparing the same will be omitted below to avoid overlapping because these are the same as described in the details on the core-shell structured organic-inorganic hybrid perovskite nanocrystalline particle and the method of preparing the same, which have been already explained.

A light emitting device according to an exemplary embodiment of the present invention will be described.

The light emitting device according to an exemplary embodiment of the present invention may be a device using a light emitting layer including the above-described core-shell structured organic-inorganic hybrid perovskite nanocrystalline particle light-emitting body or core-shell structured inorganic metal halide perovskite nanocrystalline particle light-emitting body. The core-shell structured organic-inorganic hybrid perovskite nanocrystalline particle light-emitting body or inorganic metal halide perovskite nanocrystalline particle light-emitting body may be prepared by the method described above.

For example, the light emitting device according to the present invention may include a first electrode, a second electrode, and a light emitting layer which is disposed between the first electrode and the second electrode, and includes the above-described core-shell structured organic-inorganic hybrid perovskite nanocrystalline particle light-emitting body or inorganic metal halide perovskite nanocrystalline particle light-emitting body.

As another example, a photoactive layer including the above-described core-shell structured organic-inorganic perovskite nanocrystalline particle or core-shell structured inorganic metal halide perovskite nanocrystalline particle may be applied to a solar cell. Such a solar cell may include a first electrode, a second electrode, and a photoactive layer which is disposed between the first electrode and the second electrode and includes the above-described perovskite nanocrystalline particle.

Preparation Example 1

An organic-inorganic hybrid perovskite nanocrystalline particle light-emitting body having a 3D structure according to an exemplary embodiment of the present invention was formed. The organic-inorganic hybrid perovskite nanocrystalline particle light-emitting body was formed by inverse nano-emulsion.

Specifically, a first solution was prepared by dissolving an organic-inorganic hybrid perovskite in a protic solvent. The protic solvent used herein was dimethylformamide, and the organic-inorganic hybrid perovskite used herein was $CH_3NH_3PbBr_3$. The $CH_3NH_3PbBr_3$ used herein was prepared by mixing $CH_3NH_3Br$ with $PbBr_2$ at a ratio of 1:1.

In addition, a second solution was prepared by dissolving an alkyl halide surfactant in an aprotic solvent. The aprotic solvent used herein was toluene, and the alkyl halide surfactant used herein was octadecylammonium bromide ($CH_3(CH_2)_{17}NH_3Br$).

Subsequently, the first solution was slowly added dropwise to the second solution while harshly stirring, thereby forming an organic-inorganic hybrid perovskite nanocrystalline particle light-emitting body having a 3D structure.

Afterward, such an organic-inorganic hybrid perovskite nanocrystalline particle solution was applied on a glass substrate by spin coating, thereby forming an organic-inorganic hybrid perovskite nanocrystalline particle film (OIP-NP film).

The organic-inorganic hybrid perovskite nanocrystalline particle formed herein has a size of approximately 20 nm.

Preparation Example 2

An organic-inorganic hybrid perovskite nanocrystalline particle light-emitting body having a 3D structure according to an exemplary embodiment of the present invention was formed using $CH_3(CH_2)_{13}NH_3Br$ as an alkyl halide surfactant in the same manner as described in Preparation Example 1.

The organic-inorganic hybrid perovskite nanocrystalline particle formed herein has a size of approximately 100 nm.

Preparation Example 3

An organic-inorganic hybrid perovskite nanocrystalline particle light-emitting body having a 3D structure according to an exemplary embodiment of the present invention was formed using $CH_3(CH_2)_{10}NH_3Br$ as an alkyl halide surfactant in the same manner as described in Preparation Example 1.

The organic-inorganic hybrid perovskite nanocrystalline particle formed herein has a size of approximately 300 nm.

Preparation Example 4

An organic-inorganic hybrid perovskite nanocrystalline particle light-emitting body having a 3D structure according to an exemplary embodiment of the present invention was formed using $CH_3(CH_2)_7NH_3Br$ as an alkyl halide surfactant in the same manner as described in Preparation Example 1.

The organic-inorganic hybrid perovskite nanocrystalline particle formed herein has a size of approximately 500 nm.

Preparation Example 5

An organic-inorganic hybrid perovskite nanocrystalline particle light-emitting body having a 3D structure according to an exemplary embodiment of the present invention was formed using $CH_3(CH_2)_4NH_3Br$ as an alkyl halide surfactant in the same manner as described in Preparation Example 1.

The organic-inorganic hybrid perovskite nanocrystalline particle formed herein has a size of approximately 700 nm.

Preparation Example 6

An organic-inorganic hybrid perovskite nanocrystalline particle light-emitting body having a 3D structure according to an exemplary embodiment of the present invention was formed using $CH_3CH_2NH_3Br$ as an alkyl halide surfactant in the same manner as described in Preparation Example 1.

The organic-inorganic hybrid perovskite nanocrystalline particle formed herein has a size of approximately 800 nm.

Preparation Example 7

An organic-inorganic hybrid perovskite nanocrystalline particle light-emitting body having a 3D structure according to an exemplary embodiment of the present invention was formed using $CH_3NH_3Br$ as an alkyl halide surfactant in the same manner as described in Preparation Example 1.

The organic-inorganic hybrid perovskite nanocrystalline particle formed herein has a size of approximately 900 nm.

Preparation Example 8

The organic-inorganic hybrid perovskite nanocrystal according to Preparation Example 1 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 9

The organic-inorganic hybrid perovskite nanocrystal according to Preparation Example 2 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 10

The organic-inorganic hybrid perovskite nanocrystal according to Preparation Example 3 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 11

The organic-inorganic hybrid perovskite nanocrystal according to Preparation Example 4 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 12

The organic-inorganic hybrid perovskite nanocrystal according to Preparation Example 5 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 13

The organic-inorganic hybrid perovskite nanocrystal according to Preparation Example 6 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 14

The organic-inorganic hybrid perovskite nanocrystal according to Preparation Example 7 was used as a core. In addition, a second wide band-gap organic-inorganic hybrid perovskite ($MAPbCl_3$) solution was slowly added dropwise to a solution containing such an organic-inorganic hybrid perovskite nanocrystal core, thereby forming a shell including a second organic-inorganic hybrid perovskite nanocrystal ($MAPbCl_3$). As a result, a core-shell structured organic-inorganic hybrid perovskite nanocrystalline particle light-emitting body according to an exemplary embodiment of the present invention was formed.

Preparation Example 15

A process was carried out in the same manner as described in Preparation Example 8, but $(CH_3NH_3)_2PbBr_4$ was used as an organic-inorganic hybrid perovskite for a core. The $(CH_3NH_3)_2PbBr_4$ used herein was prepared by mixing $CH_3NH_3Br$ with $PbBr_2$ at a ratio of 2:1.

The core-shell structured organic-inorganic hybrid perovskite nanocrystalline particle light-emitting body formed herein emits UV light or light blue light. In the photoluminescence spectrum, the emission band was located at approximately 520 nm.

Preparation Example 16

A process was carried out in the same manner as described in Preparation Example 8, but $(CH_3NH_3)_2PbI_4$ was used as an organic-inorganic hybrid perovskite for a core. The $(CH_3NH_3)_2PbI_4$ used herein was prepared by mixing $CH_3NH_3I$ with $PbI_2$ at a ratio of 2:1.

The core-shell structured organic-inorganic hybrid perovskite nanocrystalline particle formed herein emits IR light or light red light. In the photoluminescence spectrum, the emission band was located at approximately 780 nm.

Preparation Example 17

A process was carried out in the same manner as described in Preparation Example 8, but $(CH_3NH_3)_2PbCl_xBr_{4-x}$ was used as an organic-inorganic hybrid perovskite for a core. The $(CH_3NH_3)_2PbCl_xBr_{4-x}$ used herein was prepared by mixing $CH_3NH_3Cl$ with $PbBr_2$ at a certain ratio.

The emission band in the photoluminescence spectrum of the core-shell structured organic-inorganic hybrid perovskite nanocrystalline particle formed herein was located in a range between 380 nm and 520 nm.

Preparation Example 18

A process was carried out in the same manner as described in Preparation Example 8, but $(CH_3NH_3)_2PbI_xBr_{4-x}$ was used as an organic-inorganic hybrid perovskite for a core. The $(CH_3NH_3)_2PbI_xBr_{4-x}$ used herein was prepared by mixing $CH_3NH_3I$ with $PbBr_2$ at a certain ratio.

The emission band in the photoluminescence spectrum of the core-shell structured organic-inorganic hybrid perovskite nanocrystalline particle formed herein was located in a range between 520 nm and 780 nm.

Preparation Example 19

A process was carried out in the same manner as described in Preparation Example 8, but $(CH(NH_2)_2)_2PbI_4$ was used as an organic-inorganic hybrid perovskite for a core. The $(CH(NH_2)_2)_2PbI_4$ was prepared by mixing $CH(NH_2)_2I$ with $PbI_2$ at a ratio of 2:1.

The core-shell structured organic-inorganic hybrid perovskite nanocrystalline particle formed herein emits IR light, and in the photoluminescence spectrum, the emission band was located at approximately 800 nm.

Preparation Example 20

A process was carried out in the same manner as described in Preparation Example 8, but $(CH_3NH_3)_2Pb_xSn_{1-x}I_4$ was used as an organic-inorganic hybrid perovskite for a core. The $(CH_3NH_3)_2Pb_xSn_{1-x}I_4$ used herein was prepared by mixing $CH_3NH_3I$ with $Pb_xSn_{1-x}I_2$ at a ratio of 2:1.

The emission band in the photoluminescence spectrum of the core-shell structured organic-inorganic hybrid perovskite nanocrystalline particle formed herein was located in a range between 820 nm and 1120 nm.

Preparation Example 21

A process was carried out in the same manner as described in Preparation Example 8, but $(CH_3NH_3)_2Pb_xSn_{1-x}Br_4$ was used as an organic-inorganic hybrid perovskite for a core. The $(CH_3NH_3)_2Pb_xSn_{1-x}Br_4$ used herein was prepared by mixing $CH_3NH_3Br$ with $Pb_xSn_{1-x}Br_2$ at a ratio of 2:1.

The emission band in the photoluminescence spectrum of the core-shell structured organic-inorganic hybrid perovskite nanocrystalline particle formed herein was located in a range between 540 nm and 650 nm.

Preparation Example 22

A process was carried out in the same manner as described in Preparation Example 8, but $(CH_3NH_3)_2Pb_xSn_{1-x}Cl_4$ was used as an organic-inorganic hybrid perovskite for a core. The $(CH_3NH_3)_2Pb_xSn_{1-x}Cl_4$ used herein was prepared by mixing $CH_3NH_3Cl$ with $Pb_xSn_{1-x}Cl_2$ at a ratio of 2:1.

The emission band of the photoluminescence spectrum of the core-shell structured organic-inorganic hybrid perovskite nanocrystalline particle formed herein was located in a range between 400 nm and 460 nm.

Preparation Example 23

A process was carried out in the same manner as described in Preparation Example 8, but $(C_4H_9NH_3)PbBr_4$ was used as an organic-inorganic hybrid perovskite for a core. The $(C_4H_9NH_3)PbBr_4$ used herein was prepared by mixing $(C_4H_9NH_3)Br$ with $PbBr_2$ at a ratio of 2:1.

The emission band in the photoluminescence spectrum of the core-shell structured organic-inorganic hybrid perovskite nanocrystalline particle formed herein was located at approximately 411 nm.

Preparation Example 24

A process was carried out in the same manner as described in Preparation Example 8, but $(C_5H_{11}NH_3)PbBr_4$ was used as an organic-inorganic hybrid perovskite for a core. The $(C_5H_{11}NH_3)PbBr_4$ used herein was prepared by mixing $(C_5H_{11}NH_3)Br$ with $PbBr_2$ at a ratio of 2:1.

The emission band in the photoluminescence spectrum of the core-shell structured organic-inorganic hybrid perovskite nanocrystalline particle formed herein was located at approximately 405 nm.

Preparation Example 25

A process was carried out in the same manner as described in Preparation Example 8, but $(C_7H_{15}NH_3)PbBr_4$ was used as an organic-inorganic hybrid perovskite for a core. The $(C_7H_{15}NH_3)PbBr_4$ used herein was prepared by mixing $(C_7H_{15}NH_3)Br$ with $PbBr_2$ at a ratio of 2:1.

The emission band in the photoluminescence spectrum of the core-shell structured organic-inorganic hybrid perovskite nanocrystalline particle formed herein was located at approximately 401 nm.

Preparation Example 26

A process was carried out in the same manner as described in Preparation Example 8, but $(C_{12}H_{25}NH_3)PbBr_4$ was used as an organic-inorganic hybrid perovskite for a core. The $(C_{12}H_{25}NH_3)PbBr_4$ used herein was prepared by mixing $(C_{12}H_{25}NH_3)Br$ with $PbBr_2$ at a ratio of 2:1.

The emission band in the photoluminescence spectrum of the core-shell structured organic-inorganic hybrid perovskite nanocrystalline particle formed herein was located at approximately 388 nm.

Preparation Example 27

An inorganic metal halide perovskite nanocrystalline particle light-emitting body having a 3D structure according to an exemplary embodiment of the present invention was formed. The inorganic metal halide perovskite nanocrystalline particle light-emitting body was formed by inverse nano-emulsion.

Specifically, cesium carbonate ($Cs_2CO_3$) and oleic acid were added to an aprotic solvent such as octadecene (ODE) to allow a reaction at a high temperature, thereby preparing a third solution. $PbBr_2$, oleic acid and oleylamine were added to an aprotic solvent to allow a reaction for 1 hour at a high temperature (120° C.), thereby preparing a fourth solution.

Subsequently, an inorganic metal halide perovskite nanocrystalline particle light-emitting body having a 3D structure was formed by slowly adding the first solution dropwise to the second solution while harshly stirring.

Afterward, such an inorganic metal halide perovskite nanocrystalline particle solution was applied on a glass substrate by spin coating, thereby forming an inorganic metal halide perovskite nanocrystalline particle film (OIP-NP film).

The inorganic metal halide perovskite nanocrystalline particle formed herein has a size of approximately 20 nm.

Preparation Example 28

The inorganic metal halide perovskite ($CsPbBr_3$) nanocrystal according to Preparation Example 27 was used as a core. In addition, a shell including a second inorganic metal halide perovskite nanocrystal ($CsPbCl_3$) was formed by slowly adding a second wide band-gap inorganic metal halide perovskite ($CsPbCl_3$) solution dropwise to a solution containing such an inorganic metal halide perovskite nanocrystal core, thereby forming a core-shell structured inorganic metal halide perovskite nanocrystalline particle light-emitting body according to an exemplary embodiment of the present invention.

Preparation Example 29

A light emitting device according to an exemplary embodiment of the present invention was manufactured.

First, an ITO substrate (an ITO anode-coated glass substrate) was prepared, a conductive substance PEDOT:PSS (AI4083 provided by Heraeus Group) was applied on the ITO anode by spin coating, and then the resulting substrate was thermally treated for 30 minutes at 150° C., thereby forming a hole injection layer with a thickness of 40 nm.

The hole injection layer was spin-coated with a solution in which the core-shell structured organic-inorganic hybrid perovskite nanocrystalline particle according to Preparation Example 8 was dissolved and thermally treated for 20 minutes at 80° C., thereby forming an organic-inorganic hybrid perovskite nanocrystalline particle light emitting layer.

Afterward, an electron transport layer was formed by depositing 1,3,5-tris(1-phenyl-1H-benzimidazol-2-yl)benzene (TPBI) on the organic-inorganic hybrid perovskite nanocrystalline particle light emitting layer to have a thickness of 50 nm under a high vacuum of $1\times10^{-7}$ Torr or less, an electron injection layer was formed by depositing LiF thereon to have a thickness of 1 nm, and then a cathode was formed by depositing aluminum thereon to have a thickness of 100 nm, resulting in manufacturing an organic-inorganic hybrid perovskite nanocrystalline particle light emitting device.

Preparation Example 30

A solar cell according to an exemplary embodiment of the present invention was manufactured.

First, an ITO substrate (an ITO anode-coated glass substrate) was prepared, a conductive substance PEDOT:PSS (Clevios™ PH provided by Heraeus Group) was applied on the ITO anode by spin coating, and then the resulting substrate was thermally treated for 30 minutes at 150° C., thereby forming a hole extraction layer with a thickness of 40 nm.

A photoactive layer was formed by coating the hole extraction layer with a mixture of the core-shell structured organic-inorganic hybrid perovskite nanocrystalline particle according to Preparation Example 1 and phenyl-C61-butyric acid methyl ester (PCBM), and 100 nm-thick Al was directly deposited on the photoactive layer, thereby manufacturing a perovskite nanocrystalline particle solar cell.

Comparative Example 1

A first solution was prepared by dissolving $CH_3NH_3PbBr_3$ in a protic solvent, such as dimethylformamide.

Subsequently, a $CH_3NH_3PbBr_3$ film (OIP film) was manufactured by spin-coating a glass substrate with the first solution.

Comparative Example 2

A first solution was prepared by dissolving $CH_3NH_3PbCl_3$ in a protic solvent, such as dimethylformamide.

Subsequently, a $CH_3NH_3PbCl_3$ film (OIP film) was manufactured by spin-coating a glass substrate with the first solution.

Experimental Example

Figure 7:
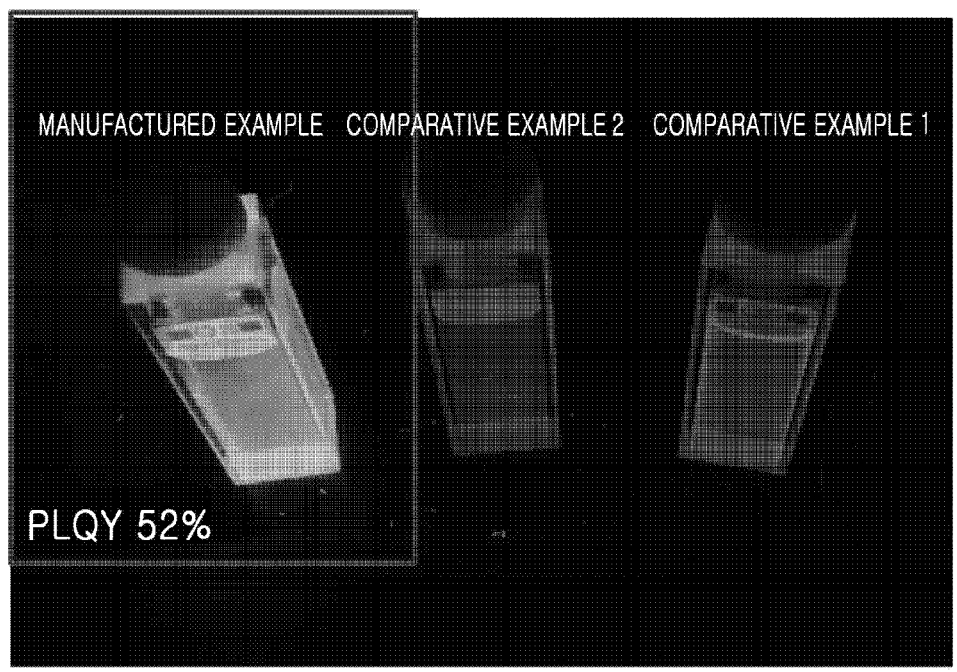
FIG. 7 shows fluorescence images obtained by taking light emitted by UV irradiation to light-emitting bodies according to Preparation Example 1 and Comparative Examples 1 and 2, respectively.

FIG. 7 shows fluorescence images obtained by taking light emitted by UV irradiation to light-emitting bodies according to Preparation Example 1 and Comparative Examples 1 and 2, respectively.

Referring to FIG. 7, it can be identified that the bulk-type organic-inorganic hybrid perovskite solutions according to Comparative Examples 1 and 2, other than the nanocrystal-type solution, emit dark light, whereas the nanocrystal-type light-emitting body according to Preparation Example 1 emits very bright green light.

It can also be identified that the organic-inorganic hybrid perovskite nanocrystalline particle light-emitting body according to Preparation Example 1 shows a very high photoluminescence quantum yield (PLQY) of 52%.

Contrarily, in Comparative Examples 1 and 2, the film-type organic-inorganic hybrid perovskites formed on the glass substrates by spin coating showed low PLQY of less than 1%.

Figure 8:
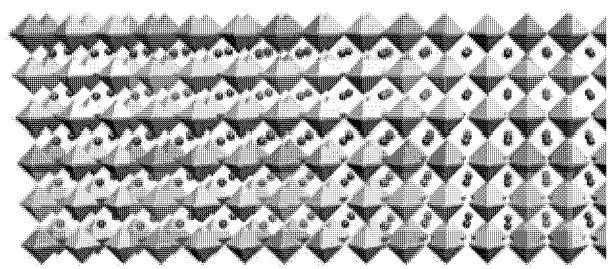
FIG. 8 shows schematic diagrams of the light-emitting bodies according to Preparation Example 1 and Comparative Example 1, respectively.
Figure 8:
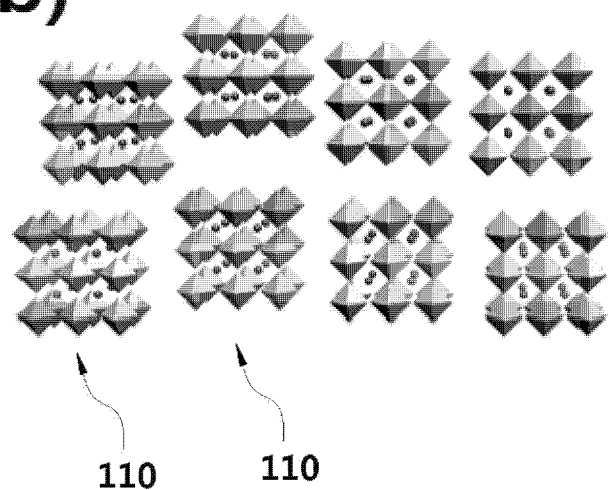

FIG. 8 shows schematic diagrams of the light-emitting bodies according to Preparation Example 1 and Comparative Example 1, respectively.

FIG. 8(A) is a schematic diagram of the light-emitting body film (OIP film) according to Comparative Example 1, and FIG. 8(B) is a schematic diagram of the light-emitting body film (OIP-NP film) according to Preparation Example 1. Referring to FIG. 8(A), Comparative Example 1 shows the film-type light-emitting body formed by spin-coating a glass substrate with the first solution, and referring to FIG. 8(B), the light-emitting body is a nanocrystal-type light-emitting body 110 according to Preparation Example 1.

Figure 9:
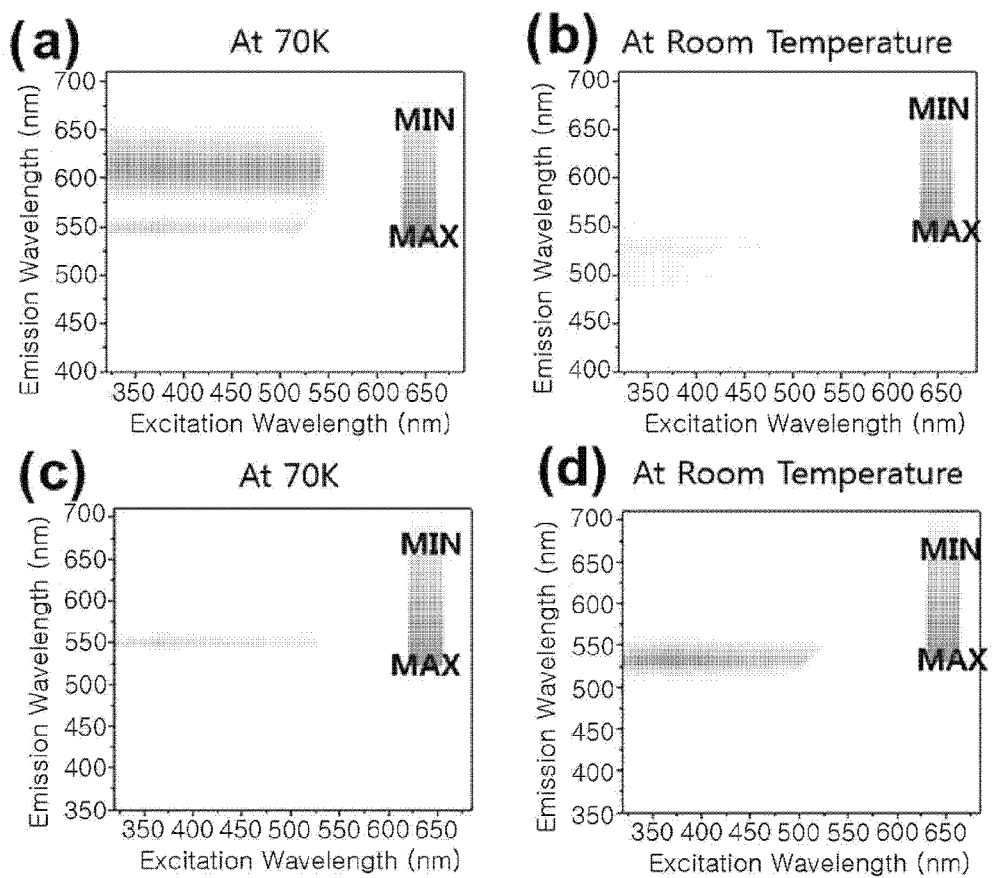
FIG. 9 shows images of the photoluminescence matrices of the light-emitting bodies according to Preparation Example 1 and Comparative Example 1 at room temperature and a low temperature.

FIG. 9 shows images of the photoluminescence matrices of the light-emitting bodies according to Preparation Example 1 and Comparative Example 1 at room temperature and a low temperature.

FIG. 9(A) is an image of a photoluminescence matrix of the film-type organic-inorganic hybrid perovskite (OIP film) according to Comparative Example 1 at a low temperature (70 K), and FIG. 9(B) is an image of a photoluminescence matrix of the film-type organic-inorganic hybrid perovskite (OIP film) according to Comparative Example 1 at room temperature.

FIG. 9(C) is an image of a photoluminescence matrix of the organic-inorganic hybrid perovskite nanocrystalline particle film (OIP-NP film) according to Preparation Example 1 at a low temperature (70 K), and FIG. 9(D) is an image of a photoluminescence matrix of the organic-inorganic hybrid perovskite nanocrystalline particle film (OIP-NP film) according to Preparation Example 1 at room temperature.

Referring to FIGS. 9(A) to 9(D), it can be seen that the organic-inorganic hybrid perovskite nanocrystalline particle film (OIP-NP film) according to Preparation Example 1 shows photoluminescence at the same location and a little higher color purity, relative to the film-type organic-inorganic hybrid perovskite (OIP film) according to Comparative Example 1. In addition, the OIP-NP film according to Preparation Example 1 shows photoluminescence at the same location and a high color purity at room temperature, but does not show a decrease in photoluminescence intensity, relative to that at a low temperature. Contrarily, the film-type organic-inorganic hybrid perovskite according to Comparative Example 1 shows different color purities and photoluminescence locations at room temperature and a low temperature, and shows a lower photoluminescence intensity at room temperature because excitons are not emitted but separated into free charges and then annihilation due to thermal ionization and delocalization of charge carriers.

Figure 10:
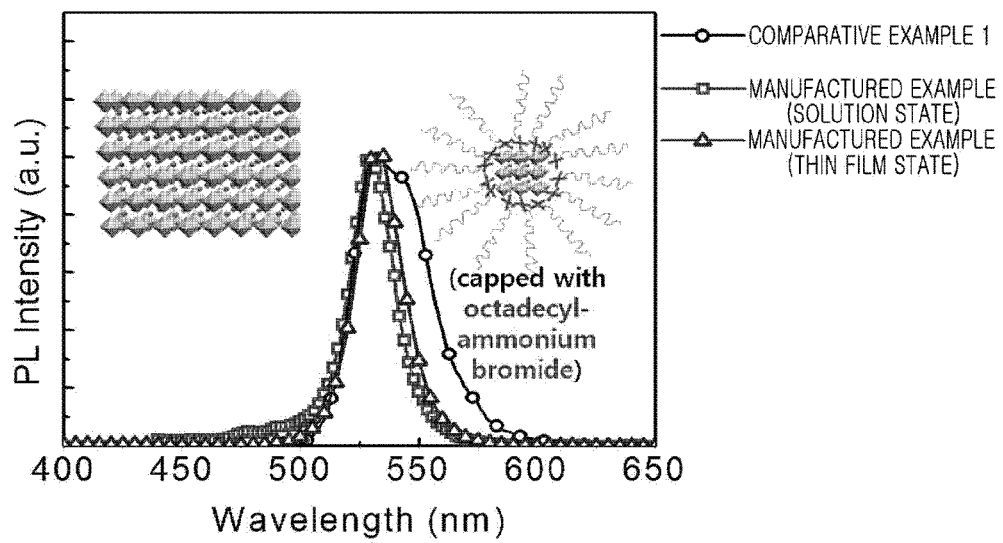
FIG. 10 is a graph showing photoluminescence of the light-emitting bodies according to Preparation Example 1 and Comparative Example 1.

FIG. 10 is a graph showing photoluminescence of the light-emitting bodies according to Preparation Example 1 and Comparative Example 1.

Referring to FIG. 10, when the organic-inorganic hybrid perovskite nanocrystalline particle light-emitting body according to Preparation Example 1 is located in a solution, thereby preparing a solution-type light-emitting body, and is prepared in a film, it can be seen that both types of light-emitting bodies show photoluminescence at the same location and a little higher color purities, compared to the organic-inorganic hybrid perovskite according to Comparative Example 1.

Figure 11:
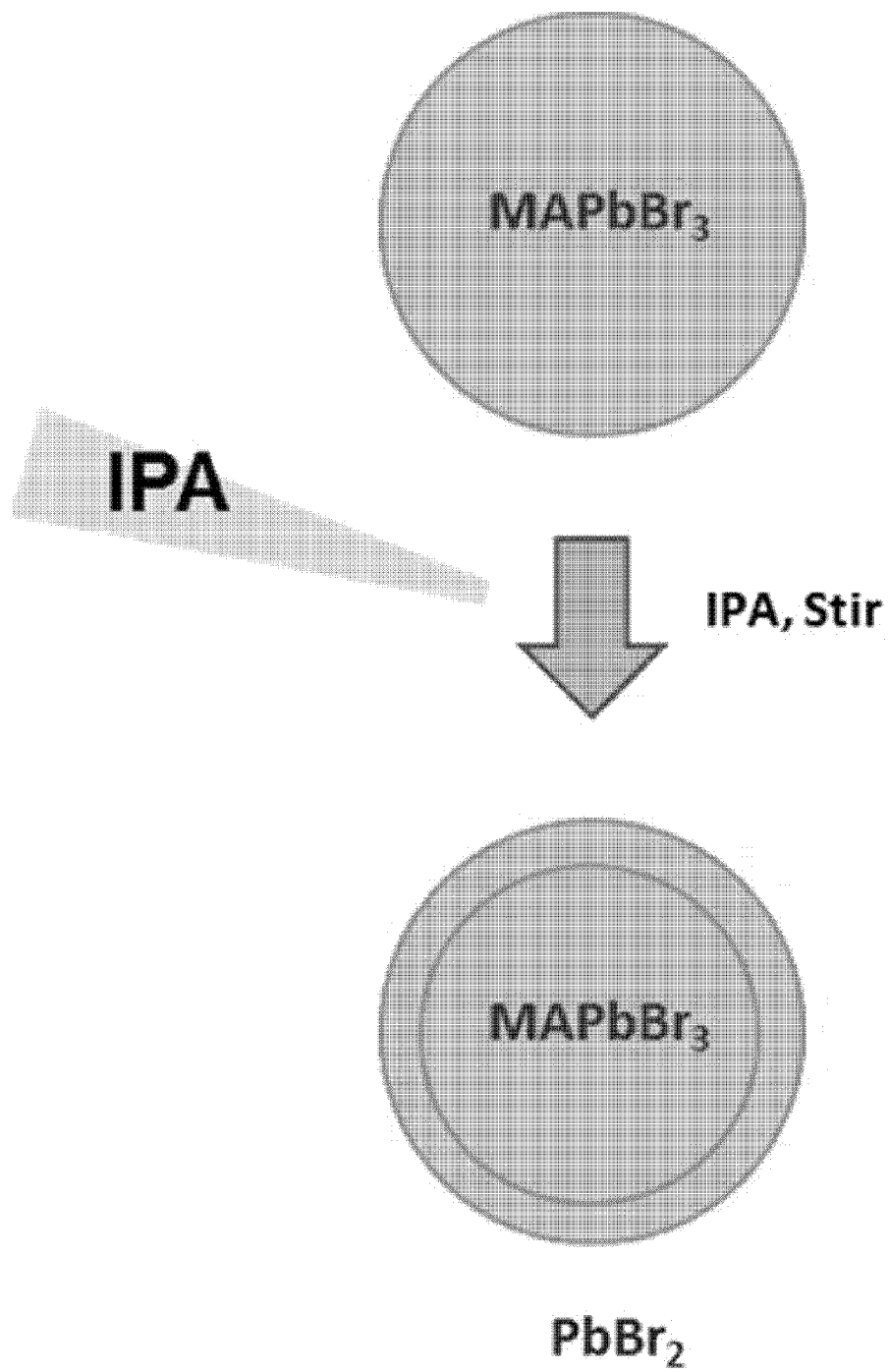
FIG. 11 is a conceptual diagram illustrating a method of preparing a core-shell structured organic-inorganic hybrid perovskite nanocrystalline particle light-emitting body according to the present invention.

FIG. 11 is a conceptual diagram illustrating a process of forming the organic-inorganic hybrid perovskite nanocrystalline particle light-emitting body according to Preparation Example 1 in a core-shell structure using an isopropyl alcohol (IPA) solution.

Referring to FIG. 11, a small amount of IPA solution was dropped to a second solution containing the organic-inorganic hybrid perovskite nanocrystalline particle light-emitting body (MAPbBr$_3$) according to Preparation Example 1, and then stirred. Here, MA in Preparation Example 1 refers to $CH_3NH_3$. In this case, only $CH_3NH_3Br$ on the surface of the nanocrystalline particle light-emitting body is selectively extracted due to IPA, and thus $PbBr_2$ only remains on the surface, thereby forming a shell. Therefore, a core-shell structured nanocrystalline particle light-emitting body may be formed.

Figure 12:
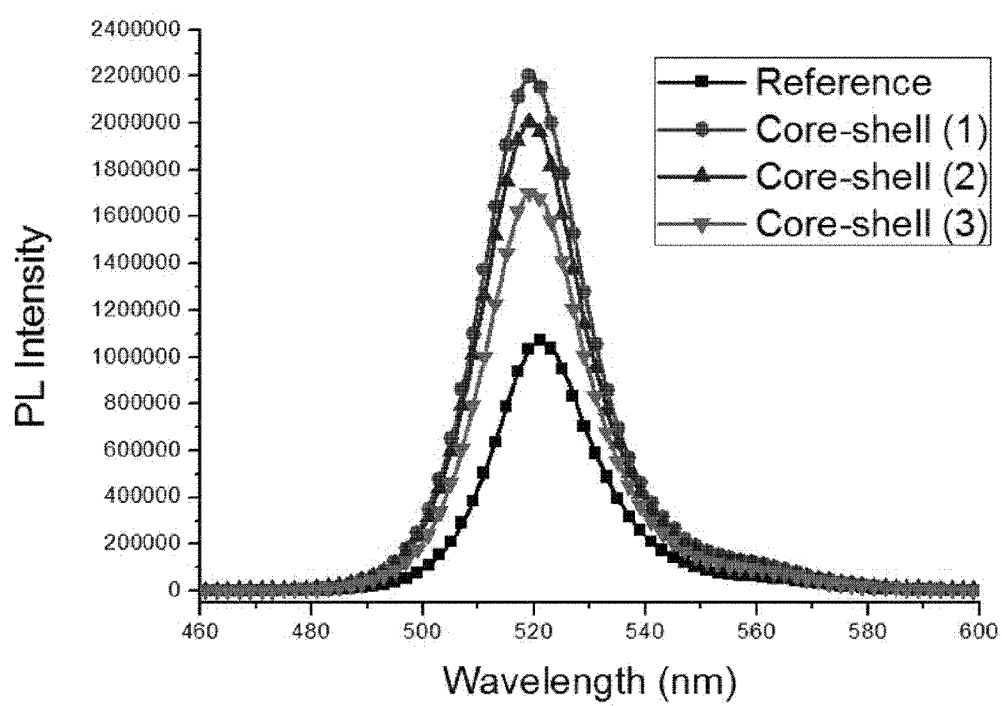
FIG. 12 is a graph showing photoluminescence intensities of core-shell structured organic-inorganic hybrid perovskite nanocrystalline particle light-emitting bodies according to the present invention.

FIG. 12 is a graph showing photoluminescence intensities of core-shell structured organic-inorganic hybrid perovskite nanocrystalline particle light-emitting bodies according to the present invention.

The organic-inorganic hybrid perovskite nanocrystalline particle light-emitting body according to Preparation Example 1 is set as a reference.

20 μl, 40 μl or 60 μl of an IPA solution was added to approximately 5 ml of a second solution in which 0.6 mol of the organic-inorganic hybrid perovskite nanocrystalline particle light-emitting body was formed according to Preparation Example 1 and then stirred, thereby forming a light-emitting body having a core-shell (1) structure, a core-shell (2) structure, or a core-shell (3) structure, respectively.

It can be seen that the nanocrystalline particle light-emitting body having the core-shell (1) structure, the core-shell (2) structure, or the core-shell (3) structure shows a stronger photoluminescence than the nanocrystalline particle light-emitting body according to Preparation Example 1.

Figure 13:
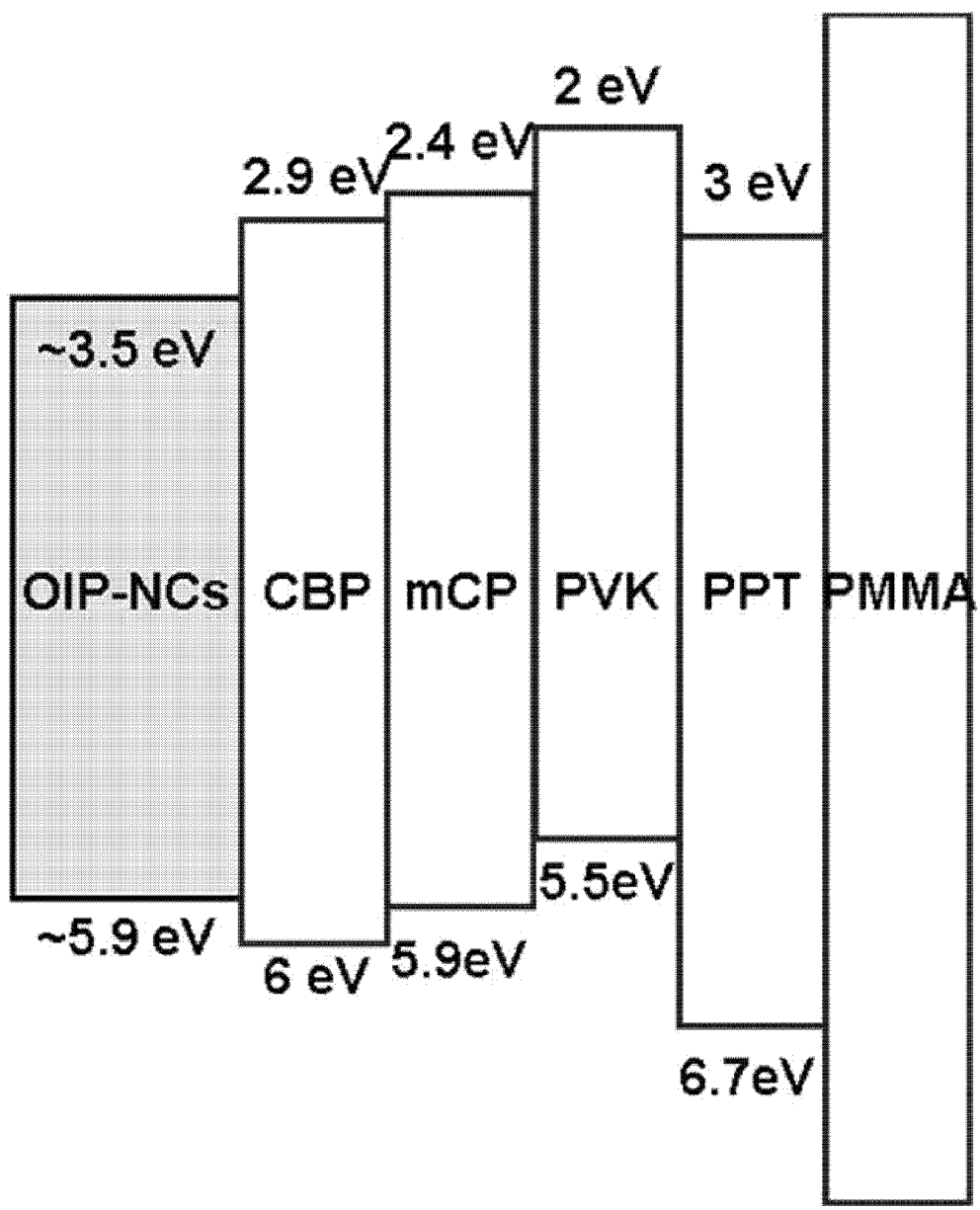
FIG. 13 is a diagram of band gaps of shell substances according to the present invention.

FIG. 13 is a diagram of band gaps of shell substances according to the present invention.

Referring to FIG. 13, when a surface of the organic-inorganic hybrid perovskite nanocrystalline particle light-emitting body (OIP-NCs) according to Preparation Example 1 was coated with an organic substance such as CBP, mCP, PVK, PPT or PMMA, which has a wider band gap than the nanocrystal, a nanocrystal having a core (nanocrystalline particle)-shell (organic substance) structure may be formed.

Figure 14:
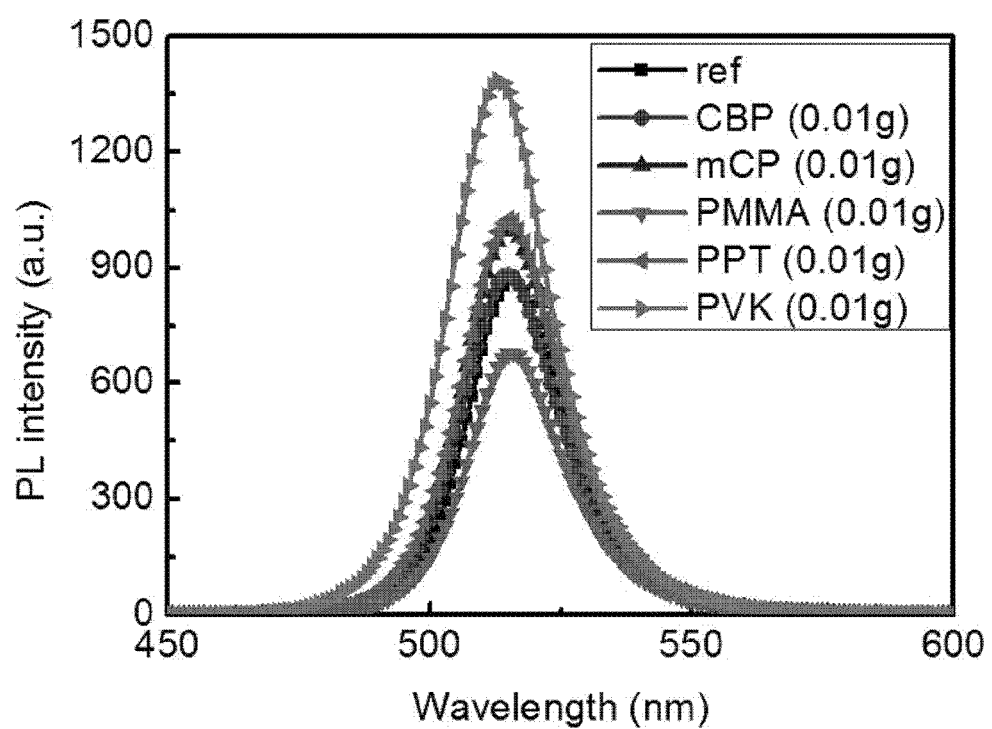
FIG. 14 is a graph showing photoluminescence intensities of core-shell structured organic-inorganic hybrid perovskite nanocrystalline particle light-emitting bodies according to the present invention.

FIG. 14 is a graph showing photoluminescence (PL) intensities of core-shell structured organic-inorganic hybrid perovskite nanocrystalline particle light-emitting bodies according to the present invention.

The organic-inorganic hybrid perovskite nanocrystalline particle light-emitting body according to Preparation Example 1 is set as a reference.

In addition, a process was carried out in the same manner as described in Preparation Example 1, except that an organic substance for a shell was also dissolved in a second solution in which an alkyl halide surfactant is dissolved in an aprotic solvent, and then the first solution was slowly added dropwise thereto, thereby forming a core (nanocrystalline particle)-shell (organic substance) structured nanocrystalline particle light-emitting body in which the surface of the organic-inorganic hybrid perovskite nanocrystalline particle light-emitting body was covered with an organic substance having a wider band gap than the nanocrystal.

Here, 0.01 g each of CBP, mCP, PMMA, PPT and PVK as the added organic substance for a shell was added, thereby forming core-shell structured nanocrystalline particle light-emitting bodies, respectively.

As a result, it can be seen that the core (nanocrystalline particle)-shell (organic substance) structured nanocrystalline particle light-emitting body shows stronger photoluminescence (PL) than that of the nanocrystalline particle light-emitting body according to Preparation Example 1.

The nanocrystalline particle light-emitting body including an organic-inorganic hybrid perovskite nanocrystal or inorganic metal halide perovskite nanocrystal according to the present invention has an organic-inorganic hybrid perovskite or inorganic metal halide perovskite with a combined crystalline structure of FCC and BCC therein, has a lamella structure in which an organic plane and an inorganic plane are alternately laminated, and exhibits high color purity because excitons are confined in the inorganic plane.

In addition, since an exciton diffusion length is reduced and exciton binding energy is increased in the nanocrystal having a size of 900 nm or less, exciton annihilation caused by thermal ionization and delocalization of charge carriers is prevented, and therefore the nanocrystalline particle light-emitting body may have high emission efficiency at room temperature.

In addition, band gap energy of the organic-inorganic hybrid perovskite nanocrystalline particle or inorganic metal halide perovskite nanocrystalline particle depends on a crystal structure, not on a particle size.

Further, compared to a 3D organic-inorganic hybrid perovskite, a 2D organic-inorganic hybrid perovskite may be synthesized as a nanocrystal, thereby increasing the exciton binding energy, and thus further improving emission efficiency, and increasing durability-stability.

Moreover, in the core-shell structured organic-inorganic hybrid perovskite nanocrystalline particle light-emitting body or inorganic metal halide perovskite nanocrystalline particle light-emitting body formed according to the present invention, as a shell is formed of a substance having a wider band gap than a core, excitons may be more strongly confined in the core, and durability of the nanocrystal may be improved to prevent exposure of the core perovskite to the air using a perovskite or inorganic semiconductor, which is stable in the air, or an organic polymer.

Meanwhile, the embodiments disclosed in the specification and drawings are only illustrated to help in understanding the present invention, and are not intended to limit the scope of the present invention. It will be apparent to those of ordinary skill in the art that other modifications based on the technical idea of the present invention are possible to be realized, in addition to the embodiments disclosed herein.

[Explanation of reference numerals]

100: Organic-inorganic hybrid perovskite nanocrystalline particle light-emitting body
100': Core-shell structured organic-inorganic hybrid perovskite nanocrystalline particle light-emitting body
110: Organic-inorganic hybrid perovskite nanocrystal core
120: Organic ligand    130: Shell

The invention claimed is:

1. A core-shell structured perovskite particle comprising:
a core comprising at least one first halide perovskite nanocrystal; and
a shell surrounding the core,
wherein the shell comprises a conjugated substance or a conjugated polymer,
wherein the core, unlike quantum dots, has a first band gap energy determined by a perovskite crystal structure of the at least one first halide perovskite nanocrystal rather than the size thereof,
wherein a plurality of ligands are attached to a surface of the shell and are configured to make the at least one first halide perovskite nanocrystal more dispersible in a medium than without such ligands, and
wherein the at least one first halide perovskite nanocrystal include an $ABX_3$, $A_2BX_4$, or $ABX_4$ structure, where A is at least one alkali metal, B is at least one metal, and X is at least one halogen.

2. The core-shell structured perovskite particle of claim 1, wherein the core-shell structured perovskite particle is dispersible in an organic solvent.

3. The core-shell structured perovskite particle of claim 1, wherein the at least one first halide perovskite nanocrystal has a spherical, cylindrical, elliptic cylindrical or polygonal cylindrical, or two-dimensional shape, wherein the two-dimensional shape is selected from a lamellar structure or a plate structure.

4. The core-shell structured perovskite particle of claim 1, wherein the at least one first halide perovskite nanocrystal has a two-dimensional (2D) or three-dimensional (3D) structure.

5. The core-shell structured perovskite particle of claim 1,
wherein A is at least one selected from a group consisting of Na, K, Rb, Cs and Fr,
wherein B is at least one selected from a group consisting of a divalent transition metal, a rare earth metal, an alkali earth metal, Pb, Sn, Ge, Ga, In, Al, Sb, Bi, and Po, and
wherein X is at least one selected from a group consisting of Cl, Br, and I.

6. The core-shell structured perovskite particle of claim 1, wherein the shell comprises the conjugated polymer and wherein the conjugated polymer is at least one selected from a group consisting of polyfluorene, poly(p-phenylene), poly(spirofluorene) and derivatives thereof.

7. The core-shell structured perovskite particle of claim 1, wherein the plurality of ligands comprises at least one selected from a group consisting of an alkyl halide and an alkyl amine.

8. The core-shell structured perovskite particle of claim 1, wherein the plurality of ligands comprises at least one selected from an alkyl halide surfactant and a carboxylic acid surfactant.

9. A light emitting device, comprising:
a first electrode;
a second electrode; and a light emitting layer disposed between the first electrode and the second electrode, wherein the light emitting layer comprises the core-shell structured perovskite particle of claim 1.

10. A core-shell structured perovskite particle comprising:
a core comprising at least one halide perovskite nanocrystal; and
a shell surrounding the core,
wherein the shell comprises a non-conjugated polymer,
wherein the core, unlike quantum dots, has a band gap energy determined by a perovskite crystal structure of the at least one halide perovskite nanocrystal rather than the size thereof,
wherein a plurality of ligands are attached to surface of the shell and are configured to make the at least one halide perovskite nanocrystal more dispersible in a medium than without such ligands, and
wherein the at least one halide perovskite nanocrystal has an $ABX_3$, $A_2BX_4$, or $ABX_4$ structure, where A is at least one alkali metal, B is at least one metal, and X is at least one halogen.

11. The core-shell structured perovskite particle of claim 10, wherein the plurality of ligands comprises at least one selected from a group consisting of an alkyl halide and an alkyl amine.

12. The core-shell structured perovskite particle of claim 11, the alkyl halide comprises a $C_nH_{2n+1}$ structure with or without at least one additional moiety selected from a group consisting of an acyclic alkyl, a primary alcohol, a secondary alcohol, a tertiary alcohol, an alkyl amine, p-substituted aniline, phenyl ammonium, and fluorine ammonium.

13. The core-shell structured perovskite particle of claim 10, wherein A comprises at least one selected from a group consisting of Na, K, Rb, Cs and Fr.

14. The core-shell structured perovskite particle of claim 13, wherein the non-conjugated polymer comprises at least one selected from a group consisting of poly(methyl methacrylate) (PMMA), poly(N-vinylcarbazole) (PVK), polyethylene glycol, polyethylene oxide, polyvinylpyrrolidone, polyethyleneimine and polyvinylalcohol (PVA).

15. The core-shell structured perovskite particle of claim 10,
wherein the plurality of ligands comprises at least one selected from an alkyl halide surfactant and a carboxylic acid surfactant.

16. A light emitting device, comprising:
a first electrode;
a second electrode; and
a light emitting layer disposed between the first electrode and the second electrode, wherein the light emitting layer comprises the core-shell structured perovskite particle according to claim 10.

* * * * *